United States Patent
Sarpatwari et al.

(10) Patent No.: US 11,476,252 B2
(45) Date of Patent: Oct. 18, 2022

(54) MEMORY DEVICE HAVING 2-TRANSISTOR VERTICAL MEMORY CELL AND SHARED CHANNEL REGION

(71) Applicant: Micron Technology, Inc., Boise, ID (US)

(72) Inventors: Karthik Sarpatwari, Boise, ID (US); Kamal M. Karda, Boise, ID (US); Durai Vishak Nirmal Ramaswamy, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 17/003,019

(22) Filed: Aug. 26, 2020

(65) Prior Publication Data

US 2021/0066300 A1 Mar. 4, 2021

Related U.S. Application Data

(60) Provisional application No. 62/893,013, filed on Aug. 28, 2019.

(51) Int. Cl.
*H01L 27/108* (2006.01)
*G11C 11/401* (2006.01)

(52) U.S. Cl.
CPC ...... *H01L 27/10802* (2013.01); *G11C 11/401* (2013.01)

(58) Field of Classification Search
CPC ............. H01L 27/10802; H01L 27/108; H01L 27/11556; H01L 29/7889; G11C 11/401; G11C 11/404
See application file for complete search history.

(56) References Cited

U.S. PATENT DOCUMENTS 5,357,464 A 10/1994 Shukuri et al.
5,712,817 A 1/1998 Suh
(Continued)

FOREIGN PATENT DOCUMENTS

JP H05110016 4/1993
TW 200534280 10/2005
(Continued)

OTHER PUBLICATIONS

"Taiwanese Application Serial No. 109129638, Office Action dated May 10, 2021", w English Translation, 8 pgs.
(Continued)

*Primary Examiner* — Edward Chin
(74) *Attorney, Agent, or Firm* — Schwegman Lundberg & Woessner, P.A.

(57) ABSTRACT

Some embodiments include apparatuses and methods of forming the apparatuses. One of the apparatuses includes a first data line located in a first level of the apparatus; a second data line located in a second level of the apparatus; a first memory cell located in a third level of the apparatus between the first and second levels, the first memory cell including a first transistor coupled to the first data line, and a second transistor coupled between the first data line and a charge storage structure of the first transistor; and a second memory cell located in a fourth level of the apparatus between the first and second levels, the second memory cell including a third transistor coupled to the second data line, and a fourth transistor coupled between the second data line and a charge storage structure of the third transistor, the first transistor coupled in series with the third transistor between the first and second data lines.

20 Claims, 18 Drawing Sheets

(56) References Cited

U.S. PATENT DOCUMENTS

2011/0002159 A1    1/2011   Suzuki et al.
2012/0051116 A1    3/2012   Inoue et al.
2018/0061834 A1*   3/2018   Derner .................. H01L 27/108

FOREIGN PATENT DOCUMENTS

| TW | 200541081 | 12/2005 |
| TW | 201727834 | 8/2017 |
| TW | 201832240 | 9/2018 |
| TW | 201842507 | 12/2018 |
| TW | 201913680 | 4/2019 |
| TW | 202123427 | 6/2021 |
| WO | 2021041558 | 3/2021 |

OTHER PUBLICATIONS

"International Application Serial No. PCT US2020 048021, International Search Report dated Dec. 4, 2020", 3 pgs.
"International Application Serial No. PCT US2020 048021, Written Opinion dated Dec. 4, 2020", 5 pgs.

\* cited by examiner

MEMORY DEVICE HAVING 2-TRANSISTOR VERTICAL MEMORY CELL AND SHARED CHANNEL REGION

PRIORITY APPLICATION

This application claims the benefit of priority to U.S. Provisional Application Ser. No. 62/893,013, filed Aug. 28, 2019, which is incorporated herein by reference in its entirety.

BACKGROUND

Memory devices are widely used in computers and many other electronic items to store information. Memory devices are generally categorized 2 into two types: volatile memory device and non-volatile memory device. A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The memory device described herein also includes multiple memory cells stacked one over another. This can further allow the described memory device to have a relatively higher storage density in comparison with some volatile conventional memory devices (e.g., dynamic random-access memory (DRAM) devices). The described memory device can include a single access line (e.g., word line) to control the two transistors of a memory cell. This can lead to reduced power dissipation and improved processing. Other improvements and benefits of the described memory device and its variations are discussed below with reference to FIG. 1 through FIG. 18.

Figure 1:
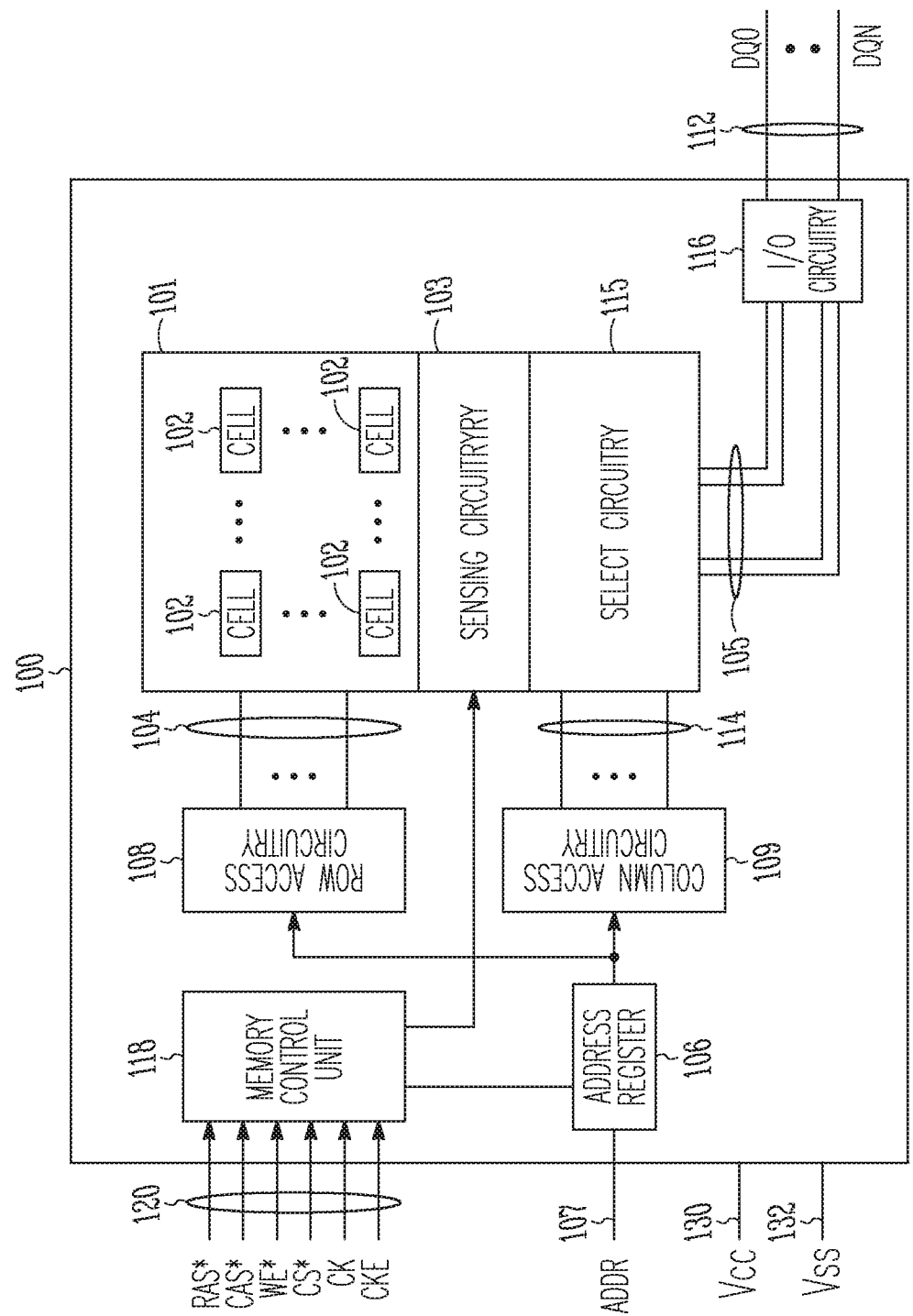
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes DRAM device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 18.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. FIG. 18.

Figure 2:
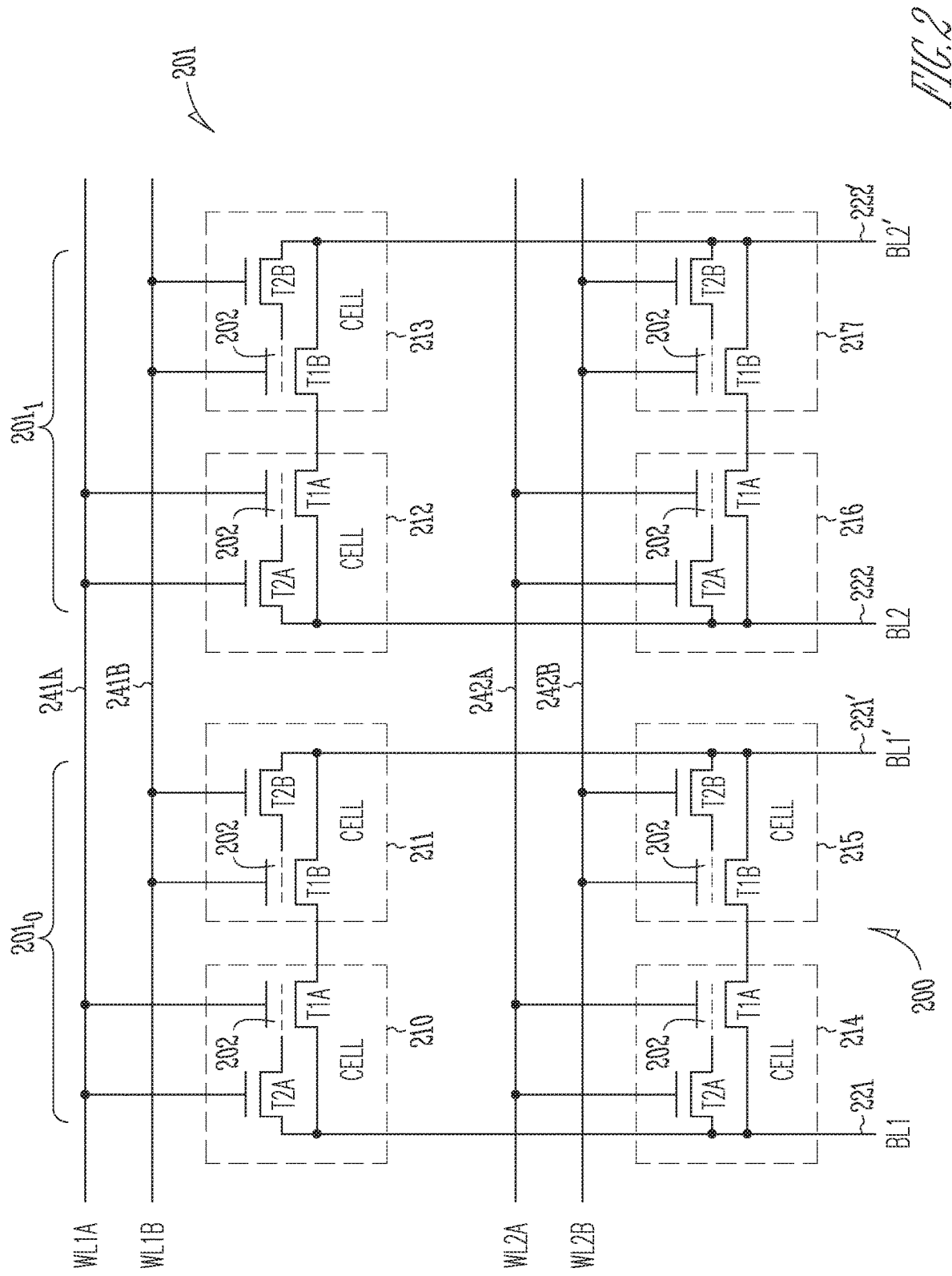
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201 of 2T memory cells, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 217, which are volatile memory cells (e.g., DRAM cells). For simplicity, similar or identical elements among memory cells 210 through 217 are given the same labels.

Each of memory cells 210 through 217 can include two transistors (e.g., either a combination of transistors T1A and T2A or a combination of transistors 1B and T2B). Thus, each of memory cells 210 through 217 can be called a 2T memory cell (e.g., 2T gain cell). Each of transistors T1A, T2A, T2A, and T2B can include a field-effect transistor (FET). As an example, each of transistors T1A and T1B can be a p-channel FET (PFET), and each of transistors T2A and T2B can be an of n-channel FET (NFET). Part of each of transistors T1A and T1B can include a structure of a p-channel metal-oxide semiconductor (PMOS) transistor FET (PFET). Thus, each of transistors TI A and TI B can include an operation similar to that of a PMOS transistor. Part of each of transistors T2A and T2B can include a structure an n-channel metal-oxide semiconductor (NMOS). Thus, transistors T2A and T2B can include an operation similar to that of a NMOS transistor.

Each of transistors T1A and T1B of memory device 200 can include a charge-storage based structure (e.g., a floating-gate based). As shown in FIG. 2, each of memory cells 210 through 217 can include a charge storage structure 202, which can include the floating gate of transistor T1A or T1B. Charge storage structure 202 can form the memory element of a respective memory cell among memory cells 210 through 215. Charge storage structure 202 can store charge. The value (e.g., "0" or "1") of information stored in a particular memory cell among memory cells 210 through 217 can be based on the amount of charge in charge storage structure 202 of that particular memory cell.

As shown in FIG. 2, transistor T2A (or T2B) (e.g., the channel region of the transistor) of a particular memory cell among memory cells 210 through 217 can be electrically coupled to (e.g., directly coupled to) charge storage structure 202 of that particular memory cell. Thus, a circuit path (e.g., current path) can be formed directly between transistor T2A (or T2B) of a particular memory cell and charge storage structure 202 of that particular memory cell during an operation (e.g., a write operation) of memory device 200.

Memory cells 210 through 217 can be arranged in memory cell groups $201_0$ and $201_1$. For example, memory cell group $201_0$ can include memory cells 210, 211, 214, and 215, and memory cell group $201_1$ can include memory cells 212, 213, 216, and 217. FIG. 2 shows two memory cell groups (e.g., $201_0$ and $201_1$) as an example. However, memory device 200 can include more than two memory cell groups.

Within each of groups $201_0$ and $201_1$, the memory cells can form different memory cell pairs (pairs of memory cells) between a data line pair (two data lines). For example, groups $201_0$ can include two memory cell pairs: a memory cell pair (a pair of memory cells) 210-211 (that includes memory cells 210 and 211) between data lines 221 and 221', and a memory cell pair (a pair of memory cells) 214-215 (that includes memory cells 214 and 215) between data lines 221 and 221'. In another example, groups $201_1$ can include two memory cell pairs: a memory cell pair 212=213 (that includes memory cells 212 and 213) between data lines 222 and 222', and a memory cell pair 216-217 (that includes memory cells 216 and 217) between data lines 222 and 222'. Memory cell groups $201_0$ and $201_1$ can include the same number of memory cell pairs (e.g., the same number of memory cells). FIG. 2 shows two memory cells in each of memory cell groups $201_0$ and $201_1$ as an example. However, the number of memory cell pairs in memory cell group $201_0$ and $201_1$ can be different from two.

Memory device 200 can perform a write operation to store information in memory cells 210 through 217, and a read operation to read (e.g., sense) information from memory cells 210 through 217. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1A (or T1B). During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241A, 241B, 242A, and 242B that can carry respective signals (e.g., word line signals) WL1A, WL1B, WL2A, and WL2B. Access lines 241A, 241B, 242A, and 242B can be used to access both memory cell groups $201_0$ and $201_1$. Each of access lines 241A, 241B, 242A, and 242B can be structured as at least one conductive line (one conductive line or multiple conductive lines that can be electrically coupled (e.g., shorted) to each other). Access lines 241A, 241B, 242A, and 242B can be selectively activated during an operation (e.g., read or write operation) of memory device 200 to access a selected memory cell (or selected memory cells) among memory cells 210 through 217. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) the transistors (e.g., T1A and T2A or T1B and T2B) of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors (e.g., T1A and T2A or T1B and T2B) of a respective memory cell to access the respective memory cell. This technique can save space and simplify operation of memory device 200. Further, as shown in FIG. 2, two memory cells (e.g., memory cells 210 and 211) can be coupled in series between a pair of data lines (e.g., data lines 221 and 221').

In memory device 200, the gate of each of transistors T1A, T2A, T2A, and T2B can be part of a respective access line (e.g., a respective word line). As shown in FIG. 2, the gate of each of transistors T1A and T2A of memory cell 210 can be part of access line 241A. The gate of each of transistors T1B and T2B of memory cell 211 can be part of access line 241B. For example, in the structure of memory device 200, different portions of a conductive material (or materials) that form access line 241A can form the gates (e.g., two gates) of transistors T1A and T2A of memory cell 210. In another example, a conductive material (or materi-als) that form access line 241B can form the gates (e.g., two gates) of transistors T1B and T2B of memory cell 211. Similarly, the gates of the transistors to each of the other memory cells (e.g., memory cells 212 through 217) can be part of a respective access line.

As described above, memory device 200 can include data lines (e.g., bit lines) 221, 221', 222, and 222'. Data lines 221 and 221' can be called a data line pair. Data lines 222 and 222' can be called a data line pair. Data lines 221 and 221' can carry respective signals (e.g., bit line signals) BL1 and BL1'. Data lines 222 and 222' can carry respective signals (e.g., bit line signals) BL2 and BL2'. During a read operation, memory device 200 can use data lines 221 and 221' to obtain information read (e.g., sense) from a selected memory cell of memory cell group $201_0$, and data lines 222 and 222' to read information from a selected memory cell of memory cell group $201_1$. During a write operation, memory device 200 can use data lines 221 and 221' to provide information to be stored in a selected memory cell of memory cell group $201_0$, and data lines 222 and 222' to provide information to be stored in a selected memory cell of memory cell group $201_1$.

In the description herein, a memory cell pair refers to two adjacent memory cells coupled in series with each between a data line pair (e.g., bit line pair). A data line pair refers to two data lines of a memory cell group (e.g., group $201_0$ or $201_1$). For example, data lines 221 and 221' (or 222 and 222') form a data line pair. For example, in FIG. 2, memory cells 210 and 211 form a memory cell pair.

As shown in FIG. 2, transistors T1A and T1B (e.g., the channel regions of transistors T1A and T1B) of a memory cell pair (e.g., memory cells 210 and 211) can be coupled in series with each other and can be electrically coupled to (e.g., directly coupled to) data lines 221 and 221'. During an operation (e.g., a read operation) performed on a selected memory cell, a circuit path (e.g., current path) can be formed between a data line pair (e.g., data lines 221 and 221') through transistors T1A and T1B of a memory cell pair that includes the selected memory cell. Thus, transistors T1A and T1B of a memory cell pair can share a circuit path (e.g., shared read channel region) between a data line pair.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210) of a memory cell pair (e.g., memory cells 210 and 211) can include a current path (e.g., read current path) between data lines (data line pair) 221 and 221' through the channel region of that particular memory cell (e.g., memory cell 210) and the channel of the other memory cell (e.g., memory cell 211) of the memory cell pair. Similarly, in memory cell group $201_1$, a read path of a particular memory cell (e.g., memory cell 212) of a memory cell pair (e.g., memory cells 212 and 213) can include a current path (e.g., read current path) between data lines (data line pair) 222 and 222' through the channel region of that particular memory cell (e.g., memory cell 212) and the channel of the other memory cell (e.g., memory cell 213) of the memory cell pair.

In the example where each of transistors T1A and T1B is a PFET (e.g., a PMOS), the current in a read path (during a read operation) can include a hole conduction (e.g., hole conduction in the direction from data line 221 to data line 221') through the channel regions of transistors T1A and T1B. Since each of transistors T1A and T1B can be used in a read path to read information from the respective memory cell during a read operation, each of transistors T1A and T1B can be called a read transistor, and the channel region of each of transistors T1A and T1B can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2A or T2B (e.g., can include a write current path through a channel region of transistor T2A or T2B) of that particular memory cell and a respective data line (e.g., data line 221 or 221') coupled to that particular memory cell. Similarly, in memory cell group $201_1$, a write path of a particular memory cell can include transistor T2A or T2B (e.g., can include a write current path through a channel region of transistor T2A or T2B) of that particular memory cell and a respective data line (e.g., data line 222 or 222').

In the example where each of transistors T2A and T2B is an NFET (e.g., NMOS), the current in a write path (e.g., during a write operation) through the channel region of transistor T2A of a selected memory cell can include an electron conduction through the channel region of transistor T2A of the selected memory cell. The current in a write path (e.g., during a write operation) through the channel region of transistor T2B of a selected memory cell can include an electron conduction through the channel region of transistor T2B of the selected memory cell. The direction of the electron conduction can be from a data line coupled to the selected memory cell to charge storage structure 202 of the selected memory cell 211. Since each of transistors T2A and T2B can be used in a write path to store information in a respective memory cell during a write operation, each of transistors T2A and T2B can be called a write transistor, and the channel region of each of transistors T2A and T2B can be called a write channel region.

Each of transistors T1A, T1B, T2A, and T2B can have a threshold voltage (Vt). Each of transistors (e.g., read transistors) T1A and T1B has a threshold voltage Vt1. Each of transistors (e.g., write transistors) T2A and T2B has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 of a read transistor (e.g., transistor T1A or T1B) of a selected memory cell TI on the read path during a read operation without affecting (e.g., without turning on) the write transistor (e.g., transistor T2A or T2B) of the selected memory cell on the write path. This can prevent leaking of charge (e.g., during a read operation) from charge storage structure 202 through the write transistor of the write path.

In a structure of memory device 200, the read transistors (e.g., TI A and T1B) and the write transistors (e.g., T2A and T2B) can be formed (e.g., engineered) such that threshold voltage Vt1 of the read transistor can be less than zero volts (e.g., Vt1<0V) regardless of the value (e.g., "0" or "1") of information stored in charge storage structure 202 of the read transistor, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, the read transistors (e.g., T1A and T1B) and the write transistors (e.g., T2A and T2B) can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, the read transistors (e.g., T1A and T1B) and the write transistors (e.g., T2A and T2B) can be formed (e.g., engineered) such that Vt1 (for state "0")<Vt1 (for state "1"), where Vt1 for state "0"=0V (or alternatively Vt1 for state "0">0V), and Vt1<Vt2.

During a read operation of memory device 200, only one memory cell of the same memory cell group can be selected at a time to read information from the selected memory cell. For example, memory cells 210, 211, 214, and 215 of memory cell group $201_0$ can be selected one at a time during a read operation to read information from the selected memory cell (e.g., one of memory cells 210, 211, 214, and 215 in this example). In another example, memory cells 212, 213, 216, and 217 of memory cell group $201_1$ can be selected one at a time during a read operation to read information from the selected memory cell (e.g., one of memory cells 212, 213, 216, and 217 in this example). Thus, in a read operation, only one memory of a memory cell pair of a memory cell group can be a selected memory cell at a given time.

During a read operation, memory cell pairs of different memory cell groups (e.g., memory cell groups $201_0$ and $201_1$) that share the same access line can be concurrently selected (or alternatively can be sequentially selected) and only one memory cell of a memory cell pair can be a selected memory cell. For example, one of memory cells 210 and 211 (e.g., memory cell 210) and one of memory cells 212 and 213 (e.g., memory cell 212) can be concurrently selected during a read operation to read (e.g., concurrently read) information from the two selected memory cells (e.g., memory cells 210 and 212). In another example, one of memory cells 214 and 215 (e.g., memory cell 215) and one of memory cells 216 and 217 (e.g., memory cell 217) can be concurrently selected during a read operation to read (e.g., concurrently read) information from the two selected memory cells (e.g., memory cells 215 and 217).

As described above, during a read operation of memory device 200, only one memory cell of a memory cell pair be a selected memory cell and the other memory cell of the memory cell pair can be an unselected memory cell. The read transistor (e.g., transistor T1A or T1B) of the unselected memory cell can be turned on to operate as a pass transistor (a turned-on switch). This allows a conduction current (e.g., read current) between a data line pair coupled to the selected memory cell.

The value of information read from the selected memory cell of a selected memory cell pair of memory cell group 201 during a read operation can be determined based on the value of a current (e.g., read current) detected (e.g. sensed) from a read path (described above) that includes the read transistors (e.g., transistors T1A and T1B) of the memory cell pair and data lines 221 and 221'. In memory cell group $201_1$, value of information read from the selected memory cell of a selected memory cell pair during a read operation can be determined based on the value of a current (e.g., read current) detected (e.g. sensed) from a read path (described above) that includes the read transistors (e.g., transistors T1A and T1B) of the memory cell pair and data lines 222 and 222'.

Memory device 200 can include detection circuitry (not shown) that can operate during a read operation to detect (e.g., sense) a current (e.g., current I1, not shown) on a read path that includes data lines 221 and 221', and detect a current (e.g., current I2, not shown) on a read path that includes data lines 222 and 222'. The value of the detected current can be based on the value of information stored in the selected memory cell. For example, depending on the value of information stored in the selected memory cell of memory cell group $201_0$, the value of the detected current (e.g., the value of current I1) on data line 221 can be zero or greater than zero. Similarly, depending on the value of information stored in the selected memory cell of memory cell group $201_1$, the value of the detected current (e.g., the value of current I2) between data line 222 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to write information in the selected memory cell. For example, memory cells 210, 211, 214, and 215 of memory cell group $201_0$ can be selected one at a time during a write operation to store in the selected memory cell (e.g., one of memory cells 210, 211, 214, and 215 in this example). In another example, memory cells 212, 213, 216, and 217 of memory cell group $201_1$ can be selected one at a time during a write operation to store in the selected memory cell (e.g., one of memory cells 212, 213, 216, and 217 in this example). Thus, in a write operation, only one memory of a memory cell pair of a memory cell group can be a selected memory cell at a given time.

During a write operation, memory cell pairs of different memory cell groups (e.g., memory cell groups $201_0$ and $201_1$) that share the same access line can be concurrently selected (or alternatively can be sequentially selected) and only one memory cell of a selected memory cell pair can be a selected memory cell. For example, one of memory cells 210 and 211 (e.g., memory cell 210) and one of memory cells 212 and 213 (e.g., memory cell 212) can be concurrently selected during a write operation to store (e.g., concurrently store) information (e.g., memory cells 210 and 212). In another example, one of memory cells 214 and 215 (e.g., memory cell 215) and one of memory cells 216 and 217 (e.g., memory cell 217) can be concurrently selected during a write operation to store (e.g., concurrently store) information from the two selected memory cells (e.g., memory cells 215 and 217).

Information to be stored in a selected memory cell of memory cell group $201_0$ during a write operation can be provided through a write path (described above) that includes a data line (data line 221 or 221') and the write transistor (e.g., transistor T2A or T2B) of the selected memory cell. For example, information to be stored in memory cell 210 (e.g., selected memory cell) during a write operation can be provided through data line 221 and transistor T2A of memory cell 210. In another example, information to be stored in memory cell 211 (e.g., selected memory cell) during a write operation can be provided through data line 221' and transistor T2B of memory cell 211. As described above, the value (e.g., binary value) of information stored in a particular memory cell among memory cells 210 through 217 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2A or T2B of that particular memory cell and the data line (e.g., data line 221, 221', 222, or 222') coupled to that particular memory cell. For example, a voltage having one value (e.g., 0V) can be applied on data line 221 (e.g., provide 0V to signal BL1) if information to be stored in a selected memory cell (e.g., memory cell 210 or 214) coupled to data line 221 has one value (e.g., "0"). In another example, a voltage having another value (e.g., a positive voltage) can be applied on data line 221 (e.g., provide a positive voltage to signal BL1) if information to be stored in a selected memory cell (e.g., memory cell 210 or 214) coupled to data line 221 has another value (e.g., "1"). Thus, information can be stored (e.g., directly stored) in charge storage structure 202 of a particular memory cell by providing the information to be stored (e.g., in the form of a voltage) on a write path (that includes transistor T2A or T2B) of that particular memory cell.

In the physical structure of memory device 200 (shown in FIG. 5 and FIG. 6), the read transistors (e.g., transistors T1A and T1B) of each memory cell pair can have a shared read path (e.g., shared read channel region) between a respective data line pair. For example, transistors T1A and T1B of memory cells 210 and 211, respectively, can have a shared read path (e.g., shared read channel region) between data lines 221 and 221'. In another example, transistors T1A and T1B of memory cells 212 and 213, respectively, can have a shared read path (e.g., shared read channel region) between data lines 222 and 222'. This arrangement (e.g., shared read channel region) allows memory device 200 to include multiple memory cells directly between a data line pair. Thus, more than one bit of information (e.g., two bits of data) can be stored in a memory cell area (which includes a memory cell pair) directly between a data line pair. Therefore, in comparison with some conventional memory devices (e.g., DRAM devices where one bit of information is stored in one memory cell coupled directly between two data lines), memory device 200 can have a higher density for a given device area (e.g., a given device footprint).

Figure 3:
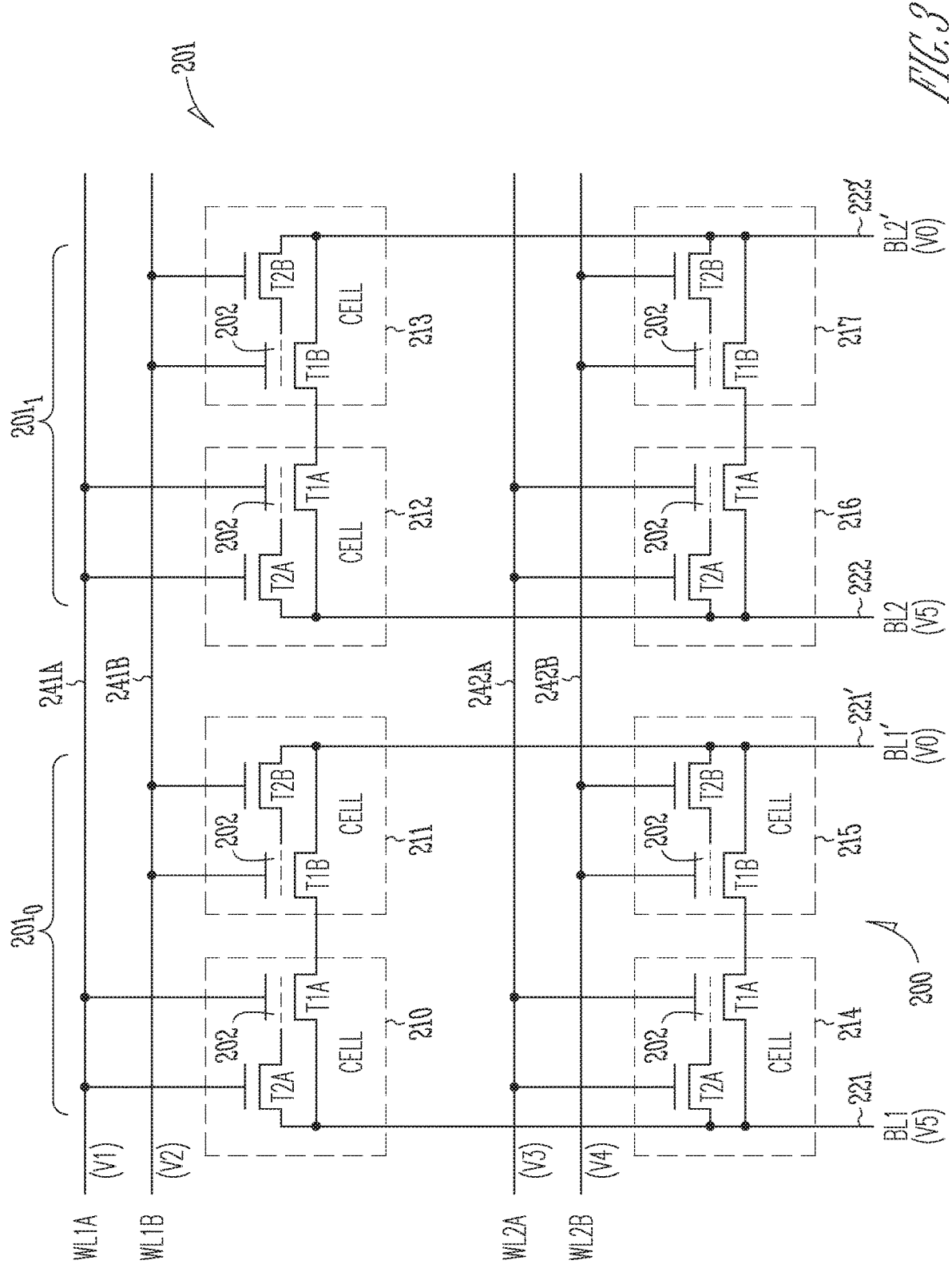
FIG. 3 shows the memory device of FIG. 2, including example voltages used during a read operation of the memory device, according to some embodiments described herein.

FIG. 3 shows memory device 200 of FIG. 2 including example voltages V0, V1, V2, V3, V4, and V5 used during a read operation of memory device 200, according to some embodiments described herein. The example of FIG. 3 assumes that memory cells 210 and 212 are selected memory cells (e.g., target memory cells) during a read operation to read (e.g., to sense) information stored (e.g., previously stored) in memory cells 210 and 212. Memory cells 214 through 217 are assumed to be unselected memory cells. This means that memory cells 214 through 217 are not accessed and information stored in memory cells 214 through 217 are not read while information is read from memory cells 210 and 212 in the example of FIG. 3.

In FIG. 3, voltages V0, V1, V2, V3, V4, and V5 can represent different voltages applied to respective access lines 241A, 241B, 242A, 242B, and data lines 221, 221', 222, and 222' during a read operation of memory device 200. Voltage V0 can be 0V (e.g., ground potential). Voltage V5 can have a value greater than the value of voltage V0. Each of voltages V3 and V4 can have a value such that transistors T1A, T1B, T2A, and T2B of each of memory cells 214 through 217 (unselected memory cells in this example) can be turned off (e.g., kept off). Voltage V1 can have a value to turn off (or keep off) transistor T2B (e.g., write transistor) of each of memory cells 210 and 212.

The value of voltage V1 can also be selected such that transistor T1A (e.g., read transistor) of each of memory cells 210 and 212 (selected memory cells in this example) can be turned on. Voltage V2 can have a value such that transistor T1B (e.g., read transistor) of each of memory cells 211 and 213 (unselected memory cells in this example) can be turned on to operate as a pass transistor (e.g., to conduct current). Voltage V5 can have a value greater than the value of voltage V0, such that a current path may be formed between data lines 221 and 221' through transistors T1A and T1B of memory cells 210 and 211, respectively, and a current path may be formed between data lines 222 and 222' through transistors T1A and T1B of memory cells 212 and 213, respectively.

Voltage V3 can have a value such that a current (e.g., read current) may be formed on a read path between data lines 221 and 221' (through transistors T1A and T1B of memory cells 210 and 211, respectively) and another current can be formed on read path (a separate read path) between data lines 222 and 222' (through transistors T1A and T1B of memory cells 212 and 213, respectively). This allows a detection of current on the read paths coupled to memory cells 210 and 212, respectively. A detection circuitry (not shown) of memory device 200 can operate to translate the value of the detected current (during reading of information from the selected memory cells) into the value (e.g., "0", "1", or a combination of multi-bit values) of information read from the selected memory cells. In the example of FIG. 3, the value of the detected currents on the read path between data lines 221 and 221' and the read path between data lines 222 and 222' can be translated into the values of information read from memory cells 210 and 211, respectively.

Figure 4:
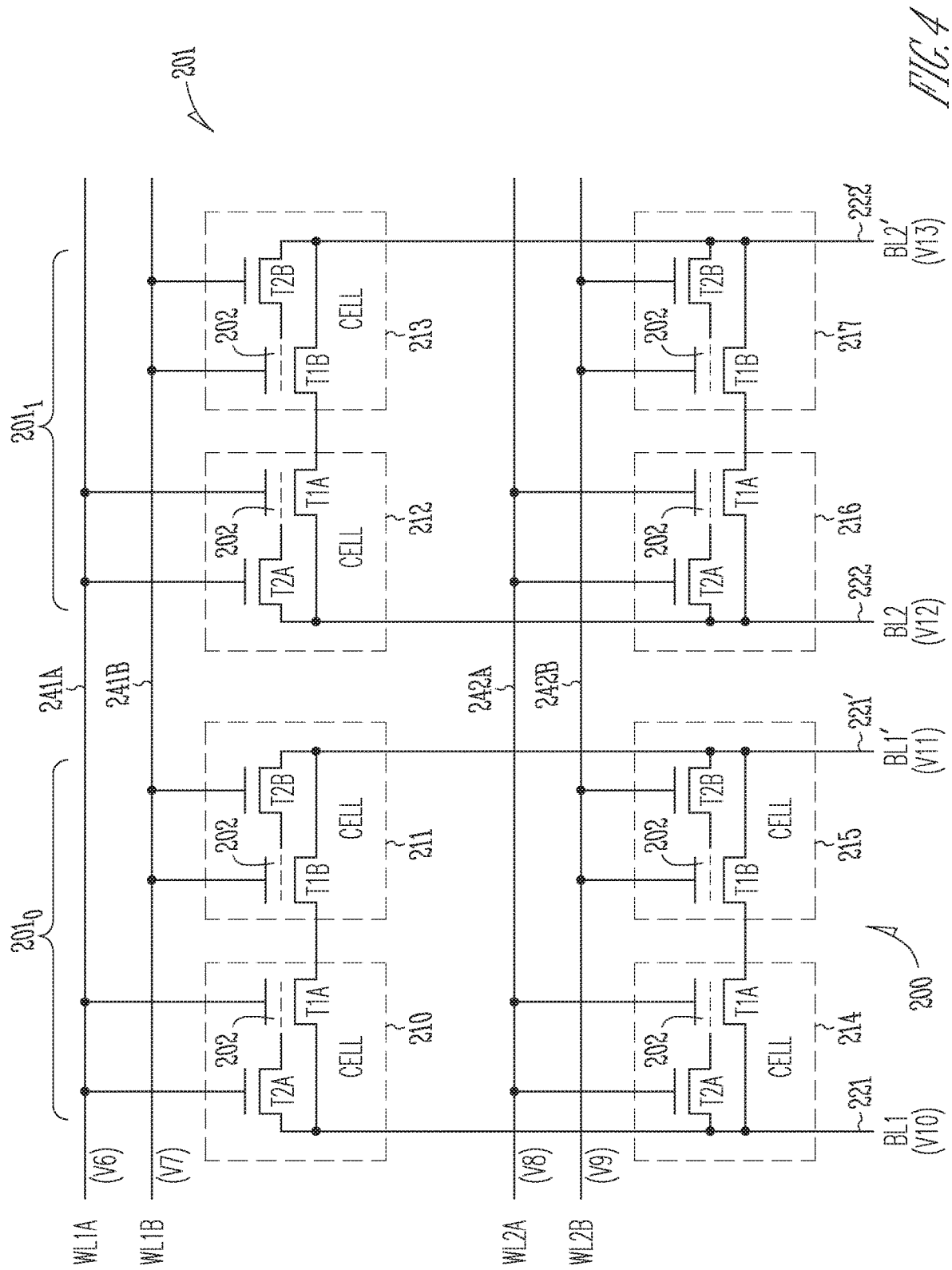
FIG. 4 shows the memory device of FIG. 2, including example voltages used during a write operation of the memory device, according to some embodiments described herein.

FIG. 4 shows memory device 200 of FIG. 2 including example voltages V6 through V13 used during a write operation of memory device 200, according to some embodiments described herein. The example of FIG. 4 assumes that memory cells 210 and 212 are selected memory cells (e.g., target memory cells) during a write operation to store information in memory cells 210 and 212. Memory cells 211, 213, 214, 215, 216, and 217 are assumed to be unselected memory cells. This means that memory cells 211, 213, 214, 215, 216, and 217 are not accessed and information is not to be stored in memory cells 211, 213, 214, 215, 216, and 217 while information is stored in memory cells 210 and 212 in the example of FIG. 4.

In FIG. 4, voltages V6 through V13 can represent different voltages applied to respective access lines 241A, 241B, 242A, 242B, and data lines 221, 221', 222, and 222' during a write operation of memory device 200. In a write operation of memory device 200 of FIG. 4, voltage V6 can have a value such that the write transistor (e.g., transistor T2A) of each of memory cells 210 and 212 (selected memory cells) can be turned on. Voltage V7, V8, and V9 can have values such that the read transistor (e.g., transistor T1B) and the write transistor of each of memory cells 211, 213, 214, 215, 216, and 217 (unselected memory cells) can be turned off (e.g., kept off).

At data lines 221, 221', 222, and 222', the value of each of voltages V11 and V13 can be 0V (e.g., ground potential). Voltages V10 and V12 can be the same or different depending on the value (e.g., "0" or "1") of information to be stored in memory cells 210 and 212. For example, the values of voltages V6 and V7 can be the same (e.g., V6=V7) if the memory cells 210 and 211 are to store information having the same value. In another example, the values of voltages V6 and V7 can be different (e.g., V6 V7) if the memory cells 210 and 211 are to store information having different values.

In the example write operation, a write path between charge storage structure 202 of memory cell 210 and data line 221 may be formed, and a write path between charge storage structure 202 of memory cell 212 and data line 222 may be formed. A current (e.g., write current) may be formed between charge storage structure 202 of memory cell 210 and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 212 and data line 222. This current can affect (e.g., change) the amount of charge on charge storage structure 202 of memory cell 212 to reflect the value of information to be stored in memory cell 212.

In the example write operation of FIG. 4, the value of voltage V10 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V12 in this example may cause charge storage structure 202 of memory cell 212 to discharge or to be charged, such that the resulting charge (e.g., charge remaining after the discharge or charge action) on charge storage structure 202 of memory cell 212 can reflect the value of information stored in memory cell 211.

Figure 5:
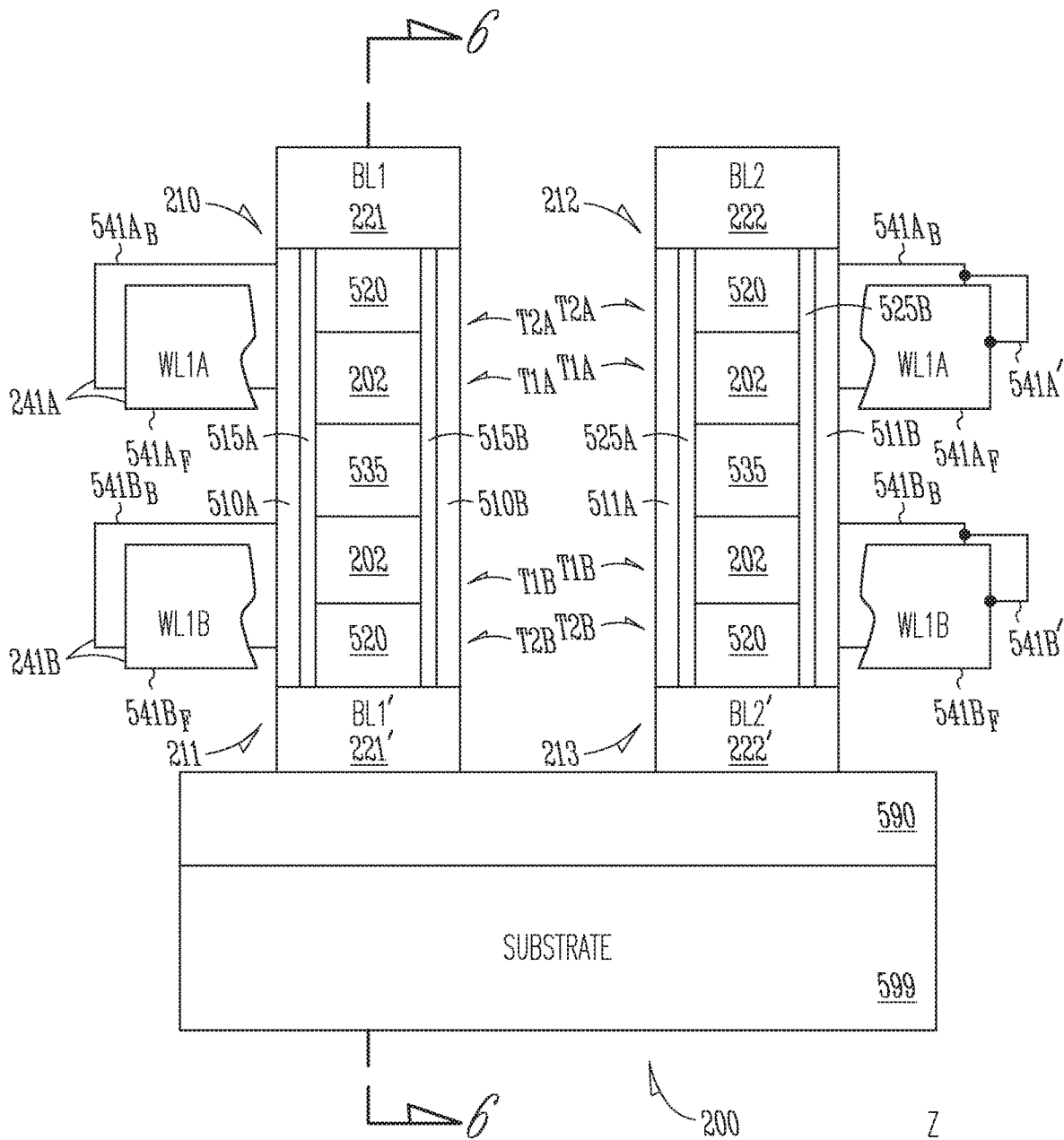
FIG. 5 and FIG. 6 show different views of a structure of the memory device of FIG. 2, according to some embodiments described herein.
Figure 6:
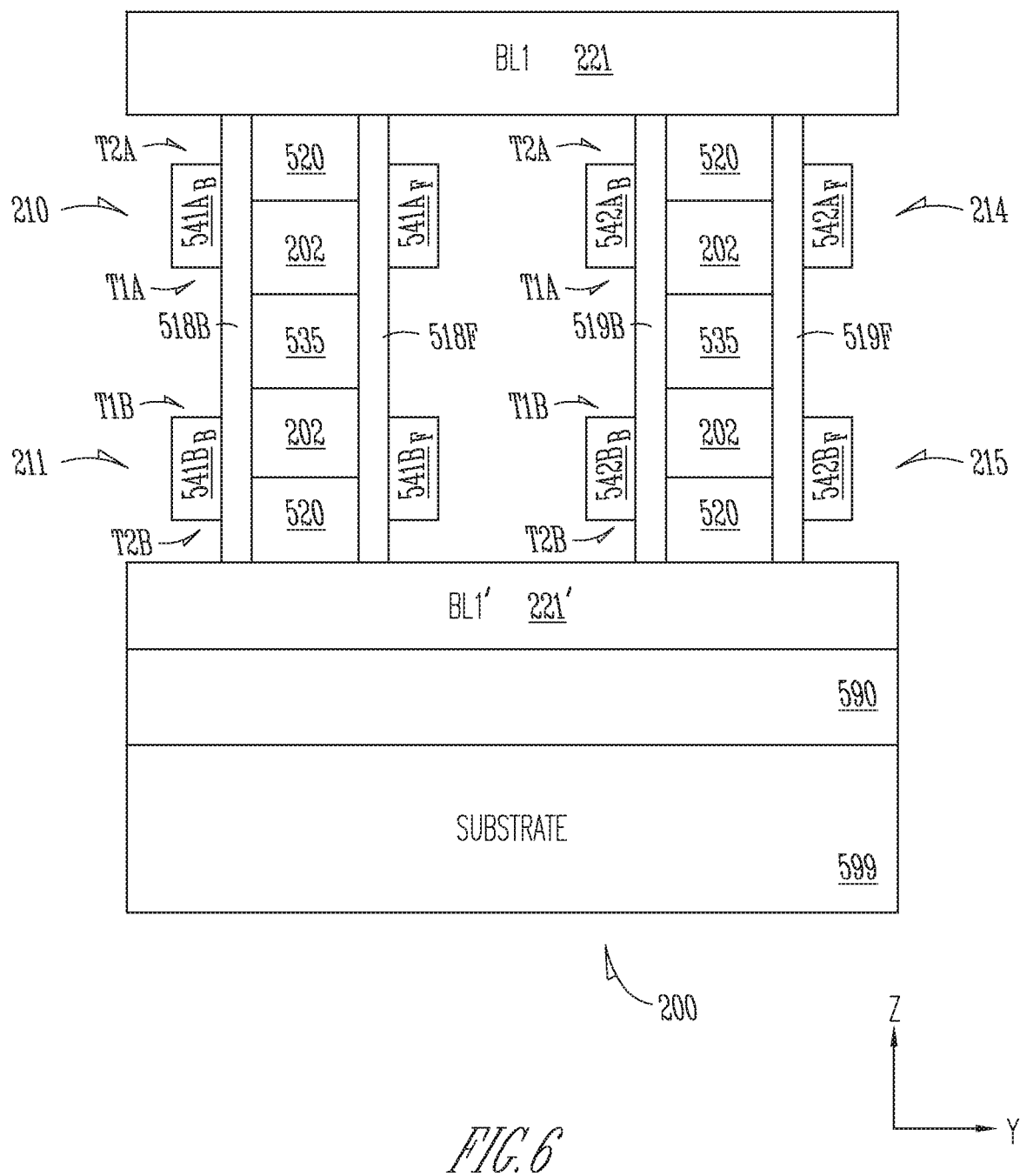

FIG. 5 and FIG. 6 show different views of a structure of memory device 200 of FIG. 2 with respect to the X, Y, and Z directions, according to some embodiments described herein. FIG. 5 shows a side view (e.g., cross-sectional view) of memory device 200 with respect to the X-Z directions. FIG. 6 shows another view (e.g., cross-sectional view) taken along line 6-6 of FIG. 5.

For simplicity, the descriptions of FIG. 5 and FIG. 6 focus on the structure of memory cells 210 and 211 (memory cell pair 210-211). The structures of other memory cells (e.g., memory cell pair 212-213 in FIG. 5, and memory cell pair 214-215 in FIG. 6) of memory device 200 of FIG. 2 can be similar to or identical to the structures of memory cells 210 and 211 shown in FIG. 5 and FIG. 6. In FIG. 5 and FIG. 6 (which show the physical structure of memory device 200) and FIG. 2 (which shows memory device 200 in circuit schematic form), the same elements are given the same reference numbers.

The following description refers to FIG. 5 and FIG. 6. For simplicity, detailed description of the same element is not repeated in the description of FIG. 5 and FIG. 6. Also for simplicity, cross-sectional lines (e.g., hatch lines) are omitted from most of the elements shown in FIG. 5 and FIG. 6 and other figures (e.g., FIG. 7 through FIG. 18) in the drawings described herein. Some elements (e.g., part of the structure) of memory device 200 may be omitted from a particular figure of the drawings so as to not obscure the description of the elements being described in that particular figure. The dimensions of the elements in the drawings (e.g., FIG. 5 through FIG. 16) described herein are not scaled.

As shown in FIG. 5 and FIG. 6, memory device 200 can include a substrate 599. Memory cells 210 and 211 can be formed in different levels (e.g., layers) of memory device 200 over substrate 599 (e.g., formed vertically with respect to substrate 599). Memory cells 212 and 213 can be formed in different levels (e.g., layers) of memory device 200 over substrate 599 (e.g., formed vertically with respect to substrate 599). Substrate 599 can be a semiconductor substrate (e.g., silicon-based substrate) or other type of substrate. The Z-direction can be a direction perpendicular to substrate 599 (e.g., a vertical direction relative to substrate 599). The X-direction and the Y-direction are perpendicular to each other and perpendicular to the Z-direction.

Memory device 200 can include a dielectric 590 formed over a portion of substrate 599. Dielectric 590 can include silicon oxide. Dielectric 590 can electrically separate the bottom data lines (e.g., data lines 221' and 222') of memory device 200 from substrate 599.

As shown in FIG. 5 and FIG. 6, each of data lines 221, 221', 222, and 222' (associated with signals BL1, BL1', BL2, and BL2', respectively) can have a length (shown in FIG. 6) in the Y-direction, a width (shown in FIG. 5) in the X-direction, and a thickness (shown in FIG. 6) in the Z-direction. The length is greater than the width, and the width can be greater than the thickness. Each of data lines 221, 221', 222, and 222' can include a conductive material (or a combination of materials) that can be structured as a conductive line (e.g., conductive region). Example materials for data lines 221, 221', 222, and 222' include metal, conductively doped polysilicon, or other conductive materials.

As shown in FIG. 5, data lines 221 and 221' can include respective conductive regions (part of respective conductive materials that form data lines 221 and 221') located in different levels (with respect to the Z-direction) of memory device 200 and electrically separated from each other. Similarly, data lines 222 and 222' can include respective conductive regions (part of respective conductive materials that form data lines 222 and 222') located in different levels of memory device 200 and electrically separated from each other. Data lines 221 and 221' can be bottom and top data lines (with respect to substrate 599 and the Z-direction), respectively. Data lines 222 and 222' can be bottom and top data lines (with respect to substrate 599 and the Z-direction), respectively.

As shown in FIG. 5 and FIG. 6, access lines 241A and 241B can be located in different levels of memory device 200. Each of access lines 241A and 241B can be located in the same levels of respective memory cells of memory device 200. For example, access line 241A (FIG. 5) can be located on the same level (with respect to the Z-direction) on which part of memory cell 210 and part of memory cell 212 are located. In another example, access line 241B (FIG. 5) can be located on the same level (with respect to the Z-direction) on which part of memory cell 211 and part of memory cell 213 are located.

Access line 241A (associated with signal WL1A) can be structured by (can include) a combination of portions $541A_F$ and $541A_B$ (e.g., front and back conductive portions of access line 241A with respect to the Y-direction). Each of portions $541A_F$ and $541A_B$ can include a conductive material (or a combination of materials) that can be structured as a conductive line (e.g., conductive region) having a length (FIG. 5) extending continuously in the X-direction. In FIG. 5, portions $541A_F$ and $541A_B$ are partially shown to avoid obstructing some parts of the other elements of memory device 200.

Each of portions $541A_F$ and $541A_B$ can include a structure (e.g., a piece (e.g., a layer)) of conductive material (e.g., metal, conductively doped polysilicon, or other conductive materials). Each of portions $541A_F$ and $541A_B$ can have a length (shown in FIG. 5) in the X-direction, a width (shown in FIG. 5) in the Z-direction, and a thickness (shown in FIG. 6) in the Y-direction, in which the length is greater than the width, and the width can be greater than the thickness.

Portions $541A_F$ and $541A_B$ can be electrically coupled to each other. For example, memory device 200 can include a conductive material (e.g., not shown) that can contact (e.g., electrically couple to) portions $541A_F$ and $541A_B$, such that portions $541A_F$ and $541A_B$ (which are part of a single access line 241A) can be concurrently applied by the same signal (e.g., signal WL1A).

Access line 241B (associated with signal WL1B) can have a structure similar to that of access line 241A. For example, as shown in FIG. 5 and FIG. 6, access line 241B be structured by (can include) a combination of portions $541B_F$ and $541B_B$ (e.g., front and back conductive portions of access line 241B with respect to the Y-direction). Each of portions $541B_F$ and $541B_B$ can include a conductive material (or a combination of materials) that can be structured as a conductive line (e.g., conductive region) having a length (FIG. 5) extending continuously in the X-direction. In FIG. 5, portions $541B_F$ and $541B_B$ are partially shown to avoid obstructing some parts of the other elements of memory device 200.

Each of portions $541B_F$ and $541B_B$ can include a structure (e.g., a piece (e.g., a layer)) of conductive material (e.g., metal, conductively doped polysilicon, or other conductive materials). Each of portions $541B_F$ and $541B_B$ can have a length (shown in FIG. 5) in the X-direction, a width (shown in FIG. 5) in the Z-direction, and a thickness (shown in FIG. 6) in the Y-direction, in which the length is greater than the width, and the width can be greater than the thickness.

Portions $541B_F$ and $541B_B$ can be electrically coupled to each other. For example, memory device 200 can include a conductive material (e.g., not shown) that can contact (e.g., electrically couple to) portions $541B_F$ and $541B_B$, such that portions $541B_F$ and $541B_B$ (which are part of a single access line 241B) can be concurrently applied by the same signal (e.g., signal WL1B).

FIG. 5 and FIG. 6 show an example where each of access lines 241A and 241B includes combination of two conductive portions (e.g., the combination of portions $541A_F$ and $541A_B$ or the combination of portions $541B_F$ and $541B_B$). However, each of access lines 241A and 241B can include only one conductive portion. For example, in an alternative structure of memory device 200, portions $541A_F$ and $541B_F$ can be omitted. In another example, in an alternative structure of memory device 200, portions $541A_B$ and $541B_B$ can be omitted. In the structure shown in FIG. 5, including two portions in each of access lines 241A and 241B can help better control transistor T1A of each of memory cell 210 and 212 during an operation (e.g., read operation) of memory device 200.

As shown in FIG. 5, memory cells 210 and 211 (which form a memory cell pair) can be located (e.g., located directly) between data lines 221 and 221'. Memory cells 212 and 213 (which form a memory cell pair) can be located (e.g., located directly) between data lines 222 and 222'. Memory device 200 can include a dielectric (e.g., silicon oxide) 535 between a respective memory cell pair. Dielectric 535 can electrically separate charge storage structure 202 of one memory cell of a memory cell pair from charge storage structure 202 of the other memory cell of the memory cell pair. For example, in pair of memory cells 210-211, dielectric 535 can electrically separate charge storage structure 202 of memory cell 210 from charge storage structure 202 of memory cell 211.

Charge storage structure 202 can include a structure (e.g., a piece (e.g., a layer)) of semiconductor material (e.g., polysilicon), a structure (e.g., a piece (e.g., a layer)) of metal, or a structure (e.g., a piece (e.g., a layer)) of material (or materials) that can trap charge. The materials for charge storage structure 202 and access lines 241A and 241B can be the same or can be different.

FIG. 5 shows an example where the top edge (edge data line 221) of charge storage structure 202 of each of memory cells 210 and 212 is at a specific distance (e.g., distance shown in FIG. 5) from the edge (e.g., bottom edge) of each of portions $541A_F$ and $541A_B$ of access line 241A. However, the distance between the top edge of charge storage structure 202 of each of memory cells 210 and 212 and the edge (e.g., bottom edge) of each of portions $541A_F$ and $541A_B$ may vary.

FIG. 5 shows an example where the bottom edge (edge closer to data line 221') of charge storage structure 202 of each of memory cells 211 and 213 is at a specific distance (e.g., distance shown in FIG. 5) from the edge (e.g., top edge) of each of portions $541B_F$ and $541B_B$ of access line 241B. However, the distance between the bottom edge of charge storage structure 202 each of memory cells 211 and 213 and the edge (e.g., top edge) of each of portions $541B_F$ and $541B_B$ may vary.

FIG. 5 shows an example where portions $541A_F$ and $541A_B$ overlap (in the Z-direction) charge storage structure 202 of each of memory cells 210 and 212. However, portions $541A_F$ and $541A_B$ may not overlap charge storage structure 202. FIG. 5 shows an example where portions $541B_F$ and $541B_B$ overlap (in the Z-direction) charge storage structure 202 of each of memory cells 211 and 213. However, portions $541A_F$ and $541A_B$ may not overlap charge storage structure 202.

As shown in FIG. 5 and FIG. 6, memory device 200 can include material 520, which can be part of (e.g., can form) the write channel region of the write transistor (e.g., transistor T2A or T2B) of each of the memory cells of memory device 200. In each of the memory cells, material 520 can contact (e.g., can be electrically coupled to) charge storage structure 202 of a respective memory cell and contact (e.g., can be electrically coupled to) a respective data line. For example, in memory cell 210, material 520 (which can form the channel region of transistor T2A of memory cell 210) can contact charge storage structure 202 of memory cell 210 and data line 221. In another example, in memory cell 211, material 520 (which can form the channel region of transistor T2B of memory cell 211) can contact charge storage structure 202 of memory cell 211 and data line 221'.

A respective material 520 can form a source (e.g., source terminal), a drain (e.g., drain terminal), a channel region (e.g., write channel region) between the source and the drain of the write transistor (e.g., transistor T2A or T2B) of the respective memory cell. For example, material 520 in memory cell 210 can form a source, a drain, and a channel region (e.g., write channel region) transistor T2A of memory cell 210. Thus, as shown in FIG. 5, the source, channel region, and the drain of transistor T2A of memory cell 210 can be formed from a single structure (e.g., a piece (e.g., a layer)) of the same material (or alternatively, a single structure (e.g., a piece (e.g., a layer)) of the same combination of materials) such as material 520. Therefore, the source, the drain, and the channel region of transistor T2A of memory cell 210 can be formed from the same material (e.g., material 520) of the same conductivity type (e.g., either n-type or p-type).

Similarly, material 520 in memory cell 211 can form a source, a drain, and a channel region (e.g., write channel region) transistor T2B of memory cell 211. Thus, as shown in FIG. 5, the source, channel region, and the drain of transistor T2A of memory cell 211 can be formed from a single structure (e.g., a piece (e.g., a layer)) of the same material (or alternatively, a single structure (e.g., a piece (e.g., a layer)) of the same combination of materials) such as material 520. Therefore, the source, the drain, and the channel region of transistor TBA of memory cell 210 can be formed from the same material (e.g., material 520) of the same conductivity type (e.g., either n-type or p-type). Other memory cells (e.g., memory cells 212 and 213 in FIG. 5 and memory cells 214 and 215 in FIG. 6) can have a write channel region (e.g., formed from material 520) for the write transistor (T1A or T1B) like memory cell 210 and 211.

Material 520 can include a structure (e.g., a piece (e.g., a layer)) of semiconductor material. In the example where the transistor is a PFET (as described above with reference to FIG. 2), material 520 can include p-type semiconductor material (e.g., p-type silicon).

In another example, the material that forms material 520 can include a structure (e.g., a piece (e.g., a layer)) of oxide material. Examples of the oxide material used for material 520 include semiconducting oxide materials, transparent conductive oxide materials, and other oxide materials.

As an example, material 520 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the material listed above in memory device 200 provides improvement and benefits for memory device 200. For example, during a read operation, to read information from a selected memory cell (e.g., memory cell 210 or 211 in FIG. 5 and FIG. 6), charge from charge storage structure 202 of the selected memory cell may leak to the write transistor (e.g., transistor T2A or T2B) of the selected memory cell. Using the material listed above for the channel region (e.g., material 520) of the write transistor can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

In FIG. 5, material 520 and charge storage structure 202 of a respective memory cell (e.g., memory cell 210) can be electrically coupled (e.g., directly coupled) to each other, such that material 520 can contact charge storage structure 202 of the respective memory cell (e.g., memory cell 210) without an intermediate material (e.g., without a conductive material) between charge storage structure 202 and material 520. In another example, material 520 can be electrically coupled to charge storage structure 202 of a respective memory cell, such that material 520 is not directly coupled to (not contacting) charge storage structure 202, but material 520 is coupled to (e.g., indirectly contacting) charge storage structure 202 through an intermediate material (e.g., a conductive material, not shown in FIG. 5) between charge storage structure 202 and material 520.

As shown in FIG. 5, memory device 200 can include portions 510A and 510B contacting data lines 221 and 221', and portions 511A and 511B contacting data lines 222 and 222'. Each of portions 510A and 510B can include a semiconductor material. Example materials for each of portions 510A and 510B include silicon, polysilicon (e.g., undoped or doped polysilicon), germanium, silicon-germanium, or other semiconductor materials, and semiconducting oxide materials (oxide semiconductors, e.g., SnO or other oxide semiconductors).

Portion 510A can form a shared channel region (e.g., shared read channel region) of transistors T1A and T1B of memory cells 210 and 211, respectively. Portion 510B can form a shared channel region (e.g., shared read channel region) of transistors T1A and T1B of memory cells 210 and 211, respectively. As described above with reference to FIG. 2, each of transistors T1A and T1B of memory cells 210 and 211, respectively, can includes a channel region (e.g., read channel region). In FIG. 5 and FIG. 6, the channel region of transistor T1A of memory cell 210 can include part of (e.g., the top part) of each of portions 510A and 510B. The channel region of transistor T1B of memory cell 211 can include part of (e.g., the bottom part) of each of portions 510A and 510B. As described above with reference to FIG. 2, each of memory cells 210 and 211 can include a read path (e.g., a current path between data lines 221 and 222). In FIG. 5, portions 510A and 510B can be part of the read path of each of memory cells 210 and 211 that can carry a current (e.g., read current) during a read operation of reading information from memory cell 210 or 211. For example, during a read operation, to read information from memory cell 210 or 211, portions 510A and 510B can conduct a current (e.g., read current) between data lines 221 and 221'. The direction of the read current can be from data line 221 to data line 221' (through portions 510A and 510B).

Portion 511A can form a shared channel region (e.g., shared read channel region) of transistors T1A and T1B of memory cells 212 and 213, respectively. Portion 511B can form a shared channel region (e.g., shared read channel region) of transistors T1A and T1B of memory cells 212 and 213, respectively. The channel region of transistor T1A of memory cell 212 can include part of (e.g., top part) of each of portions 511A and 511B. The channel region of transistor T1B of memory cell 213 can include part of (e.g., bottom part) of each of portions 511A and 511B. During a read operation, to read information from memory cell 212 or 213, portions 511A and 511B can conduct a current (e.g., read current) between data lines 222 and 222'. The direction of the read current can be from data line 222 to data line 222' (through portions 511A and 511B).

In the example where the read transistor (e.g., transistor T1A and T1B) is a PFET and the write transistor (e.g., transistor T2A and T2B) is an NFET, the material that forms portions 510A, 510B, 511A, 511B can have a different conductivity type from material 520 (e.g., write channel region). For example, portions 510A, 510B, 511A, and 511B can include p-type semiconductor material (e.g., p-type silicon), and material 520 can include n-type semiconductor material (e.g., n-type gallium phosphide (GaP)).

As shown in FIG. 5, memory cell 210 can include dielectrics (e.g., channel oxide regions) 515A, 515B, 525A, and 525B to separate the read channel regions from elements of respective memory cell pairs. For example, dielectrics 515A and 515B can electrically separate the read channel regions (e.g., portions 510A and 510B) of memory cells 210 and 211 from the write channel regions (e.g., material 520) and the memory elements (e.g., charge storage structure 202) of memory cells 210 and 211 respectively. In another example, dielectrics 525A and 525B can electrically separate the read channel regions (e.g., portions 511A and 511B) of memory cells 212 and 213 from the write channel regions (e.g., material 520) and the memory elements (e.g., charge storage structure 202) of memory cells 212 and 213, respectively. Example materials for dielectrics 515A and 515B can include silicon dioxide, hafnium oxide (e.g., $HfO_2$), aluminum oxide (e.g., (e.g., $Al_2O_3$), or other dielectric materials.

As shown in FIG. 5, part of portion $541A_F$ can span across (e.g., overlap in the X-direction) part of portions 510A and 510B and part of material 520 of memory cell 210. As described above, portions 510A and 510B can form part of read channel region of transistor T1A and material 520 can form part of write channel region of transistor T2A of memory cell 210. Thus, as shown in FIG. 5, part of portion $541A_F$ can span across (e.g., overlap) part of (e.g., on a side (e.g., front side) in the Y-direction) both read and write channels of transistors T1A and T2A, respectively, of memory cell 210. Although hidden from the view shown in FIG. 5, part of portion $541A_B$ can span across (e.g., overlap in the X-direction) part of (e.g., on another side (e.g., back side opposite from the front side) in the Y-direction) portions 510A and 510B and a part of material 520 of memory cell 210.

As shown in FIG. 5, access line 241A can also span across (e.g., overlap in the X-direction) part of portions 511A and 511B (e.g., part of the read channel region of transistor T1A of memory cell 212) and part of material 520 (e.g., a portion of write channel region of transistor T2A of memory cell 212).

Similarly, access line 241B can span across (e.g., overlap in the X-direction) part of the read channel region of transistor T1B of memory cell 211 and part of the write channel region of transistor T2B of memory cell 211. Access line 241B can also span across (e.g., overlap in the X-direction) part of the read channel region of transistor T1B of memory cell 213 and part of the write channel region of transistor T2B of memory cell 213.

The spanning (e.g., overlapping) of access line 241A across part of the read and write channel (as described above) of each of memory cells 210 and 212 allows access line 241A (a single access line) to control (e.g., to turn on or turn off) both transistors T1A and T2A of memory cell 210 or memory cell 212. Similarly, the spanning (e.g., overlapping) of access line 241B across part of the read and write channel (as described above) of each of memory cells 211 and 213 allows access line 241B (a single access line) to control (e.g., to turn on or turn off) both transistors T1B and T2B of memory cell 211 or memory cell 213.

As shown in FIG. 6, each of the access lines (e.g., word lines) can have portions adjacent and separated (by dielectrics) from respective sides (e.g., right and left sides in the X-direction) of material 520 and charge storage structure 202 of a respective memory cell. For example, portion $541A_F$ can be adjacent a side (e.g., right side in the X-direction in the view of FIG. 6) of a portion of each of material 520 and charge storage structure 202 of memory cell 210. In another example, portion $541A_B$ can be adjacent another side (e.g., left side (opposite from the right side) in the X-direction in the view of FIG. 6) of a portion of each of material 520 and charge storage structure 202 of memory cell 210.

As shown in FIG. 6, memory device 200 can include dielectrics (e.g., gate oxide regions) 518F, 518B, 519F, and 519B to electrically separate access lines (e.g., word lines) from elements of respective memory cell pairs. For example, dielectric 518F and 518B can electrically separate portions 541A$_F$, 541A$_B$, 541B$_F$, and 541B$_B$ of access lines 241A and 241B, respectively, from the read channel regions (e.g., portions 510A and 510B of memory cells 210 and 211 shown in FIG. 5), write channel regions (e.g., material 520), and the memory elements (e.g., charge storage structure 202) of respectively memory cells 210 and 211. In another example, dielectric 519F and 519B can electrically separate portions 542A$_F$, 542A$_B$, 542B$_F$, and 542B$_B$ of access lines 242A and 242B, respectively, from the read channel regions (e.g., not shown in FIG. 5 and FIG. 6), write channel regions (e.g., material 520), and the memory elements (e.g., charge storage structure 202) of respectively memory cells 214 and 215. Example materials for dielectrics 518F, 518B, 519F, and 519B can include silicon dioxide, hafnium oxide (e.g., Hf$_2$), aluminum oxide (e.g., (e.g., Al$_2$O$_3$), or other dielectric materials.

The material (or materials) for dielectrics (e.g., gate oxide regions) 518F, 518B, 519F, and 519B can be the same as (or alternatively, can be different from) the material (or materials) for dielectrics (e.g., gate oxide regions, shown in FIG. 5) 515A and 515B. Further, the thickness of each of dielectrics 518F, 518B, 519F, and 519B can be the same as (or alternatively, different from) the thickness of each of dielectrics 515A and 515B.

Memory device 200 described above can be formed using the techniques (e.g., processes) described below with reference to FIG. 1 through FIG. 18.

FIG. 7 through FIG. 18 show different views of elements during processes of forming a memory device 700, according to some embodiments described herein. Some or all of the processes used to form memory device 700 can be used to form memory device 200 described above with reference to FIG. 2 through FIG. 6.

Figure 7:
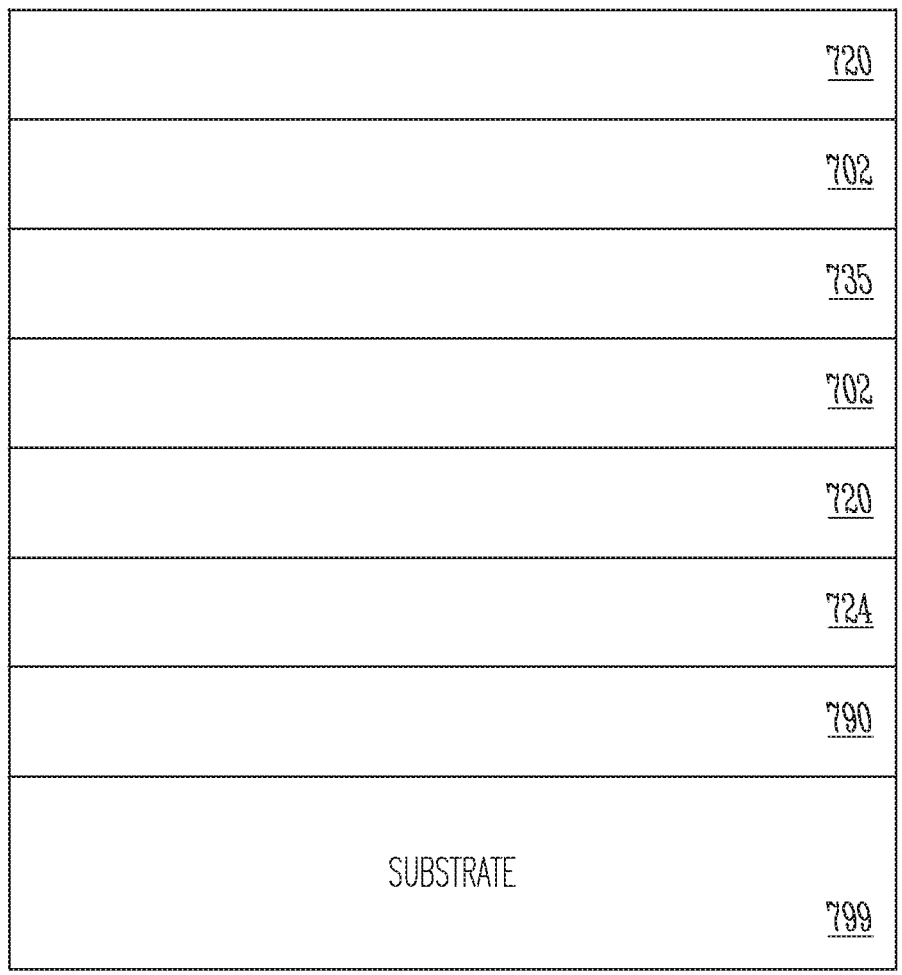
FIG. 7 through FIG. 18 show processes of forming a memory device, according to some embodiments described herein.

FIG. 7 shows memory device 700 after different levels (e.g., layers) of materials are formed in a respective level (e.g., layer) in the Z-direction of memory device 700 over a substrate 799. The different levels of materials include a dielectric material 790, a conductive material 724, a material (e.g., write channel material) 720, a material (e.g., charge storage material) 702, a dielectric material 735, a material 702 (another level of material 702), and a material 720 (another level of material 720). The levels of materials shown in FIG. 7 can be formed in a sequential fashion one material after another over substrate 799. For example, the processes used in FIG. 7 can include forming (e.g., depositing) dielectric material 790 over substrate 799, forming (e.g., depositing) a conductive material 724 over dielectric material 790, forming (e.g., depositing) material 720 over conductive material 724, forming (e.g., depositing) material 702 over material 720, forming (e.g., depositing) dielectric material 735 over material 702, forming (e.g., depositing) additional material 702 over material 735, and forming (e.g., depositing) additional material 720 over the additional material 702.

Substrate 799 can be similar to or identical to substrate 599 of memory device 200 of FIG. 5. Dielectric materials 790 and 735 can include the same dielectric material or different dielectric materials. Each of dielectric materials 790 and 735 and can include nitride material (e.g., silicon nitride (e.g., Si$_3$N$_4$)), oxide material (e.g., SiO$_2$)), or other dielectric materials. Conductive material 724 can include the same material as data lines 221 and 222 (e.g., metal, conductively doped polysilicon, or other conductive materials).

Material 720 can include the same material as write channel region (e.g., material 520) of transistors T2A and T2B of the memory cells (e.g., memory cells 210 through 215) of memory device 200 of FIG. 5. For example, material 720 can include a semiconducting material. The semiconducting material can include an oxide material. Examples of the oxide material include semiconducting oxide materials, transparent conductive oxide materials, and other oxide materials.

Material 702 can include the same material as charge storage structure 202 of the memory cells (e.g., memory cells 210 through 215) of memory device 200 of FIG. 5. For example, material 702 can include a charge storage material (or a combination of materials), which can include semiconductor material (e.g., polysilicon), metal, or other materials that can trap charge.

Figure 8:
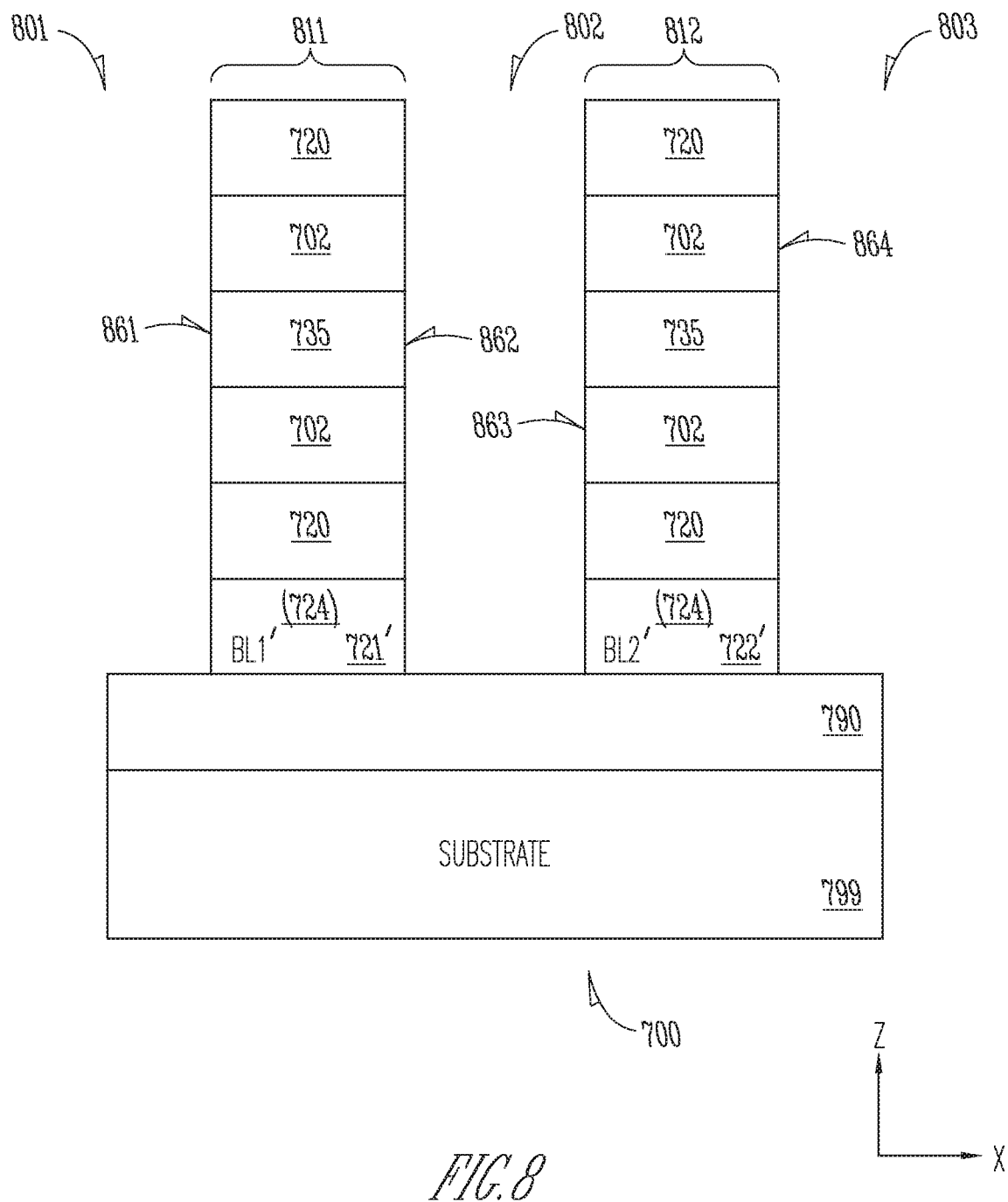

FIG. 8 shows memory device 700 after trenches (e.g., openings) 801, 802, and 803 are formed. Forming trenches 801, 802, and 803 can include removing (e.g., by patterning) a portion of each of conductive material 724, material 720 (both levels), material 702 (both levels), and dielectric material 735 at the locations of trenches 801, 802, and 803. The remaining portions of conductive material 724, material 720 (both levels), material 702 (both levels), and dielectric material 735 are included in (provided in) structures (e.g., device structures) 811 and 812, as shown in FIG. 8.

Data lines (e.g., bottom data lines) 721' and 722' (associated with signal BL1' and BL2', respectively) can be formed when structures 811 and 812 are formed. As shown in FIG. 8, the portions of material 724 at structures 811 and 812 can form data lines 721' and 722', respectively. Data lines 721' and 722' are electrically separated from each other. Each of data lines 721' and 722' can have a length (hidden from view in FIG. 8) in the Y-direction. Data lines 721' and 722' can be bottom data lines of memory device 700 and can correspond to data lines 221' and 222, respectively, of memory device 200 (FIG. 2 and FIG. 5).

In FIG. 8, each of trenches 801, 802, and 803 can have a length in the Y-direction, a width (shorter than the length) in the X-direction, and a bottom (not labeled) resting on (e.g., bounded by) a respective portion of dielectric material 790. Structures 811 and 812 can include respective side walls (e.g., opposing vertical side walls) 861, 862, 863, and 864, which also form side walls of respective trenches 801, 802, and 803. For example, structure 811 can include side walls 861 and 862, and structure 812 can include side walls 863 and 864. Side walls 862 and 863 can form side walls of trench 802.

Figure 9:
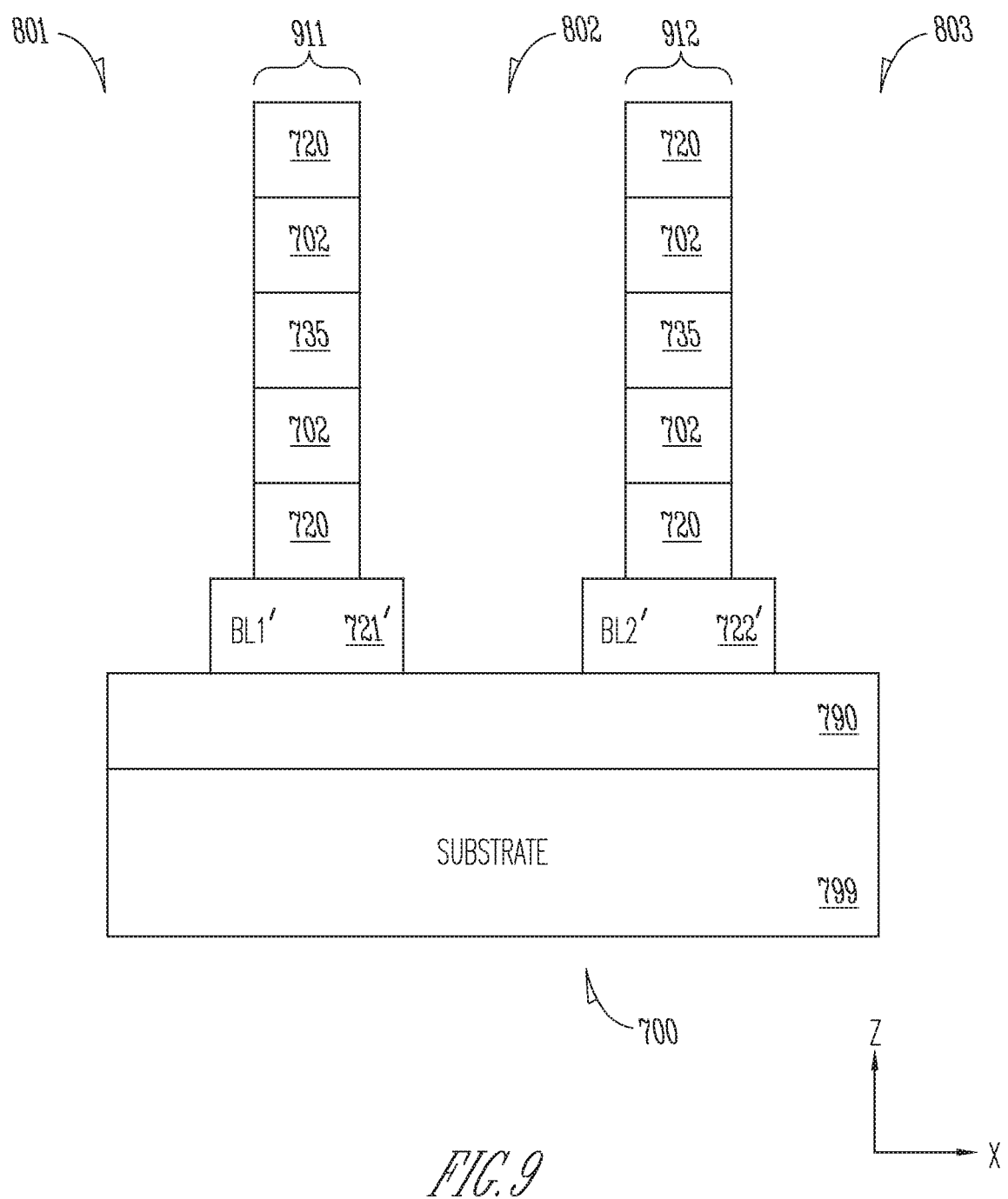

FIG. 9 shows memory device 700 after structures 911 and 912 are formed. Structures 911 and 912 are remaining portions of structures 811 and 812, respectively. Forming structures 911 and 912 can include removing a portion (e.g., side wall portions) of each of structures 811 and 812 at trenches 801, 802, and 803, such that structures 911 and 912 can have narrower portions (in the X-direction) than structures 811 and 812, respectively. For example, forming structures 911 and 912 can include removing (e.g., by etching) a portion (a portion at each of side walls 861, 862, 862, and 864) of each of conductive material 724, material 720 (both levels), material 702 (both levels). The material (material 724 in FIG. 8) that forms data lines 721' and 722' can remain unchanged (e.g., may not be etched) during the process of FIG. 9, so that each of structures 911 and 912 can have a portion (e.g., portion at data line 721' or 722') that is wider (in the X-direction) than the rest of the respective structure (structure 911 or 912).

Figure 10:
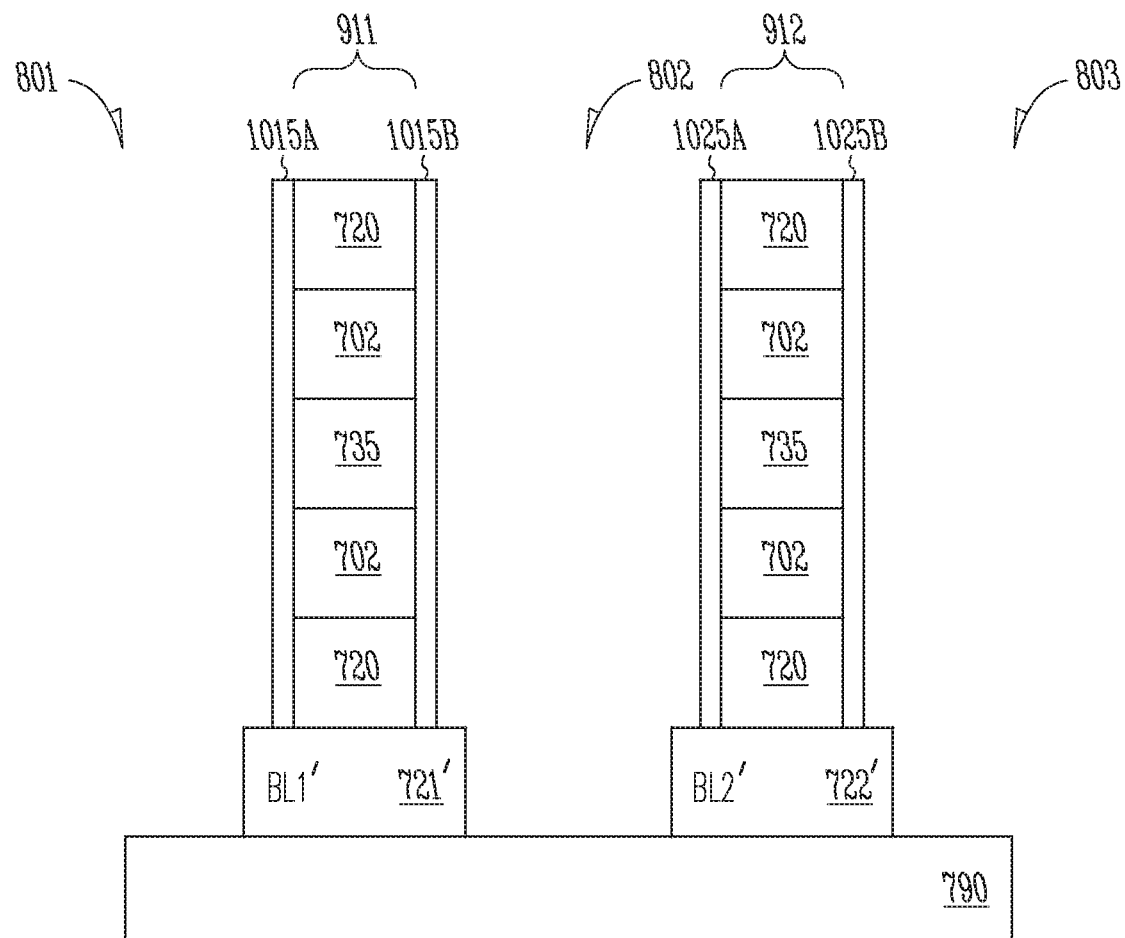

FIG. 10 shows memory device 700 after dielectric materials (e.g., dielectrics) 1015A, 1015B, 1025A, and 1025B are formed on respective side walls (not labeled) of respective structures 911 and 912 at the locations of trenches 801, 802, and 803. As shown in FIG. 10, at least a portion of each of data lines 721' and 722' is exposed at trenches 801, 802, and 803 and is uncovered by dielectrics 1015A, 1015B, 1025A, and 1025B. The material for dielectrics 1015A, 1015B, 1025A, and 1025B can be the same as the material for dielectrics (e.g., channel oxide regions) 515A and 515B of memory device 200 (FIG. 5).

Figure 11:
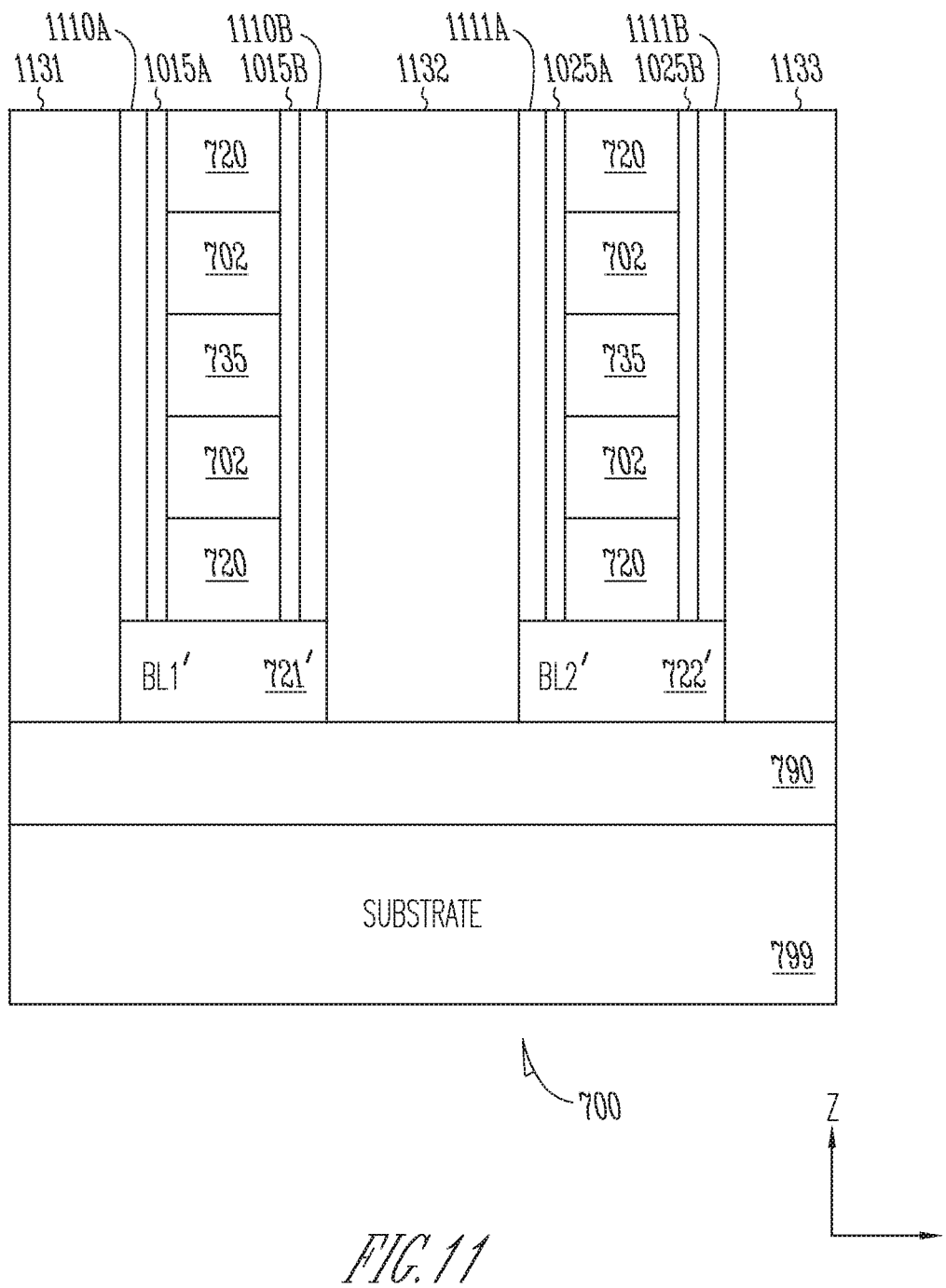

FIG. 11 shows memory device 700 after semiconductor materials 1110A, 1110B, 1111A, and 1111B are formed adjacent (e.g., formed on the sides of) dielectrics 1015A, 1015B, 1025A, and 1025B, respectively. Semiconductor materials 1110A, 1110B, 1111A, and 1111B are electrically separated from each other. As shown in FIG. 11, semiconductor materials 1110A and 1110B can contact (e.g., electrically coupled to) a portion of data line 721' (the portion that was exposed in trenches 801 and 802 in FIG. 10). Semiconductor materials 1111A and 1111B can contact (e.g., electrically coupled to) a portion of data line 722' (the portion that was exposed in trenches 801 and 802 in FIG. 10). Semiconductor materials 1110A, 1110B, 1111A, and 1111B can be subsequently processed to form a read channel region of a respective transistor (e.g., transistor T1A or T1B) of a memory cell (and a shared read channel region of a respective memory cell pair) of memory device 700. Semiconductor materials 1110A, 1110B, 1111A, and 1111B can have the same material as portions (e.g., read channel regions) 510A, 510B, 511A, and 511B of memory device 200 (FIG. 5).

Figure 12:
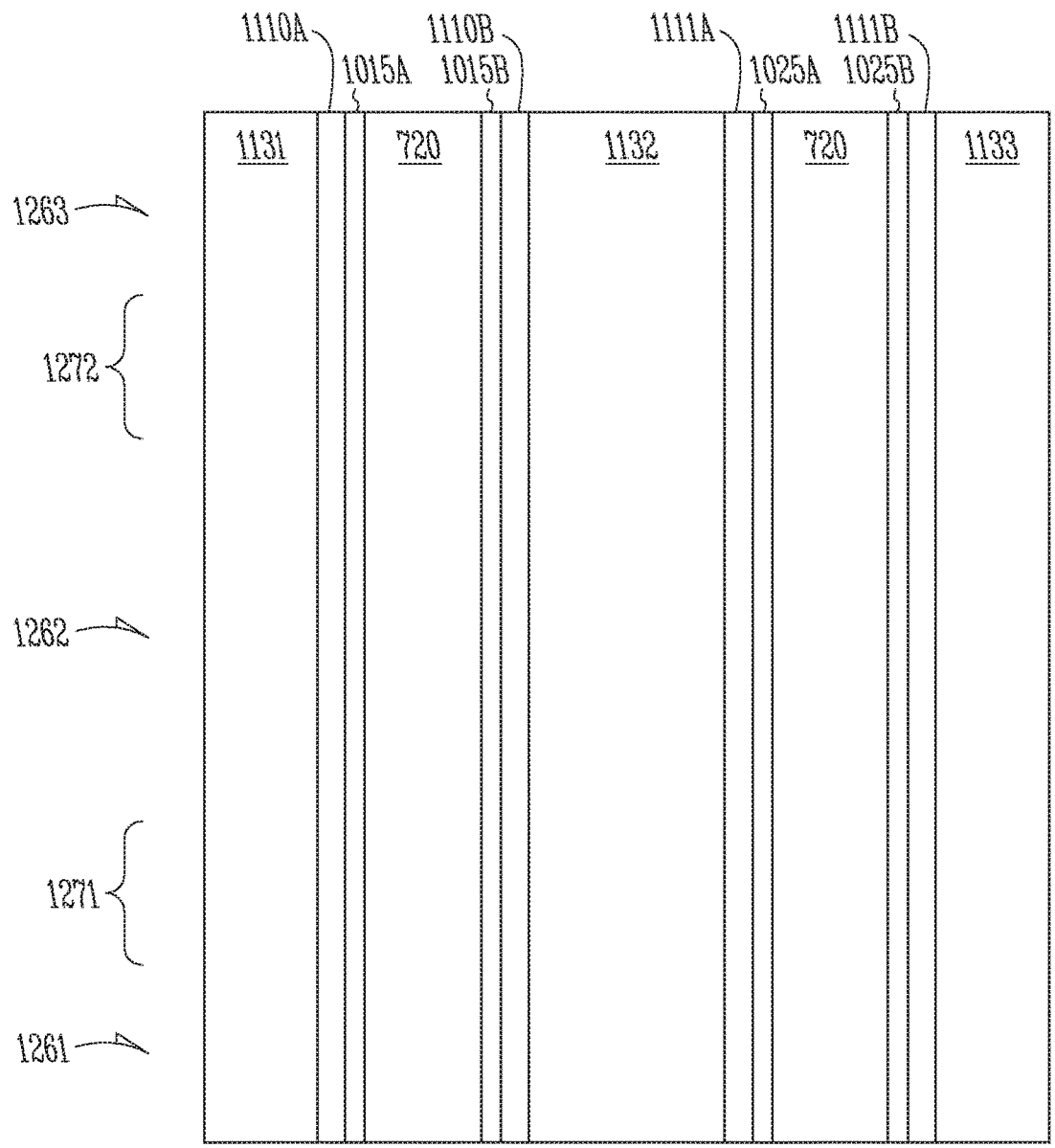
Figure 13:
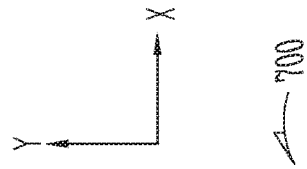

FIG. 12 shows a top view of memory device 700 with respect to the X-Y directions of memory device 700 of FIG. 11. For simplicity, the description of the same element shown in FIG. 11 and FIG. 12 is not repeated. As shown in FIG. 12, the elements of memory device 700 can include strips (e.g., lines) of materials having lengths extending in the Y-direction. Subsequent processes of forming memory device 700 can include removing (e.g., cutting (e.g., etching) in the Z-direction) the materials at locations 1261, 1262, and 1263 down to (stopping at) data lines 721' and 722' (FIG. 13). This way (stopping at data lines 721' and 722'), each of data lines 721' and 722' (which have lengths extending in the Y-direction) can remain extending continuously in the Y-direction and electrically coupled to memory cells (e.g., in column) in the Y-direction. The materials of memory device 700 at locations 1271 and 1272 can remain (and will be structures that form parts of respective memory cells of memory device 700).

FIG. 13 shows a top view of memory device 700 after trenches (e.g., openings) 1361, 1362, and 1363 are formed across the materials at locations 1261, 1262, and 1263 (FIG. 12), respectively. As shown in FIG. 13, structures 1371 and 1372 are formed at locations 1271 and 1272 (FIG. 12), respectively. As shown in FIG. 13, the materials at trenches 1361, 1362, and 1363 over substrate 799 (at locations 1261, 1262, and 1263) were removed, stopping at (e.g., down to) data lines 721' and 722'. Trenches 1361, 1362, and 1363 can be formed by removing (e.g., cut in the X-direction) part of each of the materials at locations 1261, 1262, 1263 (FIG. 12), as mentioned above. The remaining parts of the materials at locations 1271 and 1272 (FIG. 12) form (e.g., provides) structures 1371 and 1372 (FIG. 13).

Figure 17:
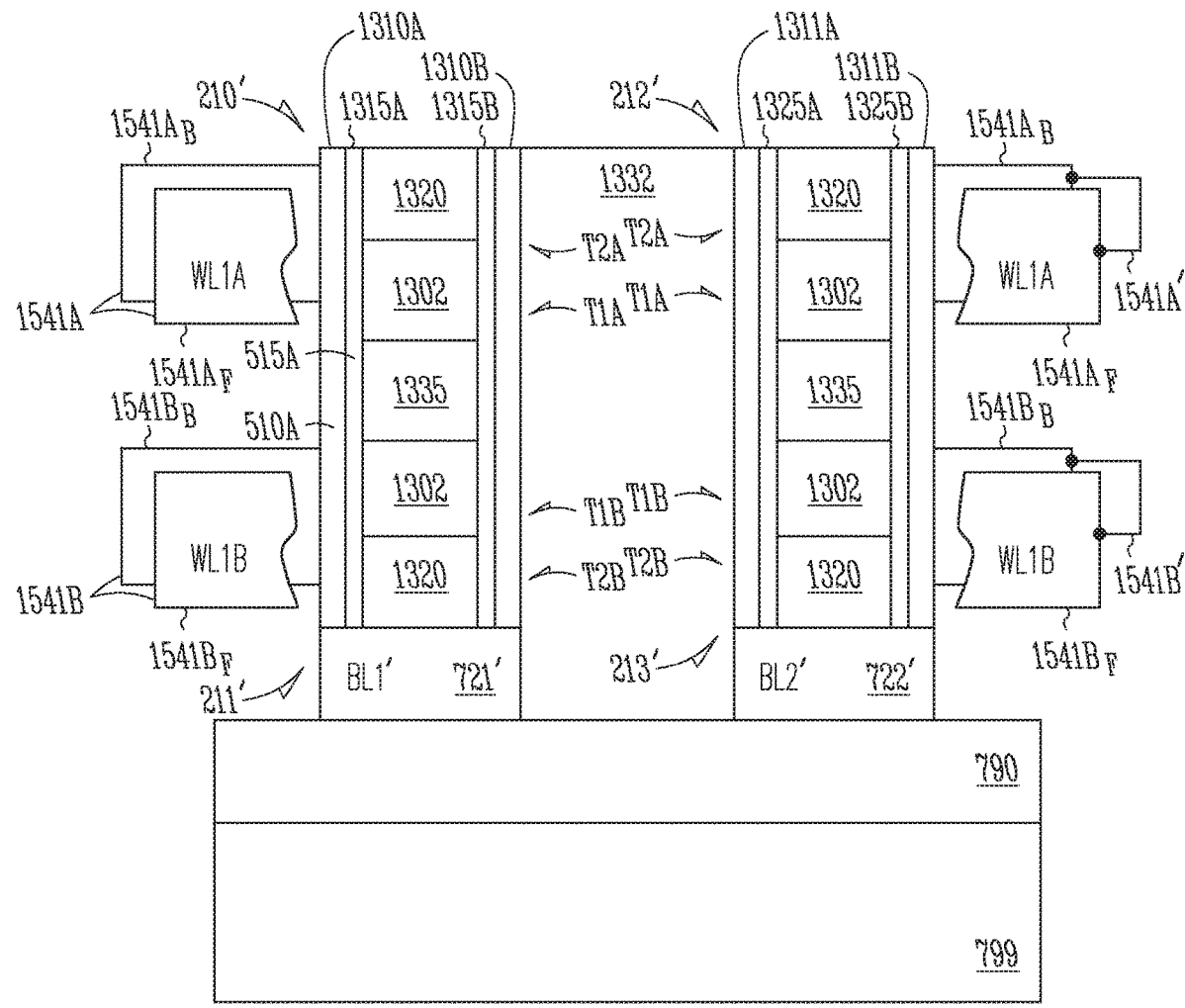

As shown in FIG. 13, structure 1372 can include portions 1310A, 1310B, 1315A, and 1315B that can form part of memory cell 210' (which can correspond to memory cell 210 of memory device 200 of FIG. 2 and FIG. 5). Portions 1310A, 1310B, 1315A, and 1315B (FIG. 13) are the remaining parts of portions 1110A, 1110B, 1015A, and 1015B (FIG. 12), respectively, after part of each of portions 1110A, 1110B, 1015A, and 1015B is removed (e.g., cut) in the process of FIG. 13. Portions 1310A and 1310B (FIG. 13) can form a read channel region for memory cell 210' (and for memory cell 211' (under memory cell 210') as shown in FIG. 17). Portions 1315A and 1315B (FIG. 13) can form dielectrics (e.g., channel oxide regions) to electrically separate portions 1310A and 1310B from other elements (e.g., write channel regions and charge storage structures) of memory cell 210' (and memory cell 211', shown in FIG. 17).

As shown in FIG. 13, structure 1371 can also include portions 1311A, 1311B, 1325A, and 1325B that can form part of memory cell 212' (which can correspond to memory cell 212 of memory device 200 of FIG. 2 and FIG. 5). Portions 1311A, 1311B, 1325A, and 1325B (FIG. 13) are the remaining parts of portions 1111A, 1111B, 1025A, and 1025B (FIG. 12), respectively, after part of each of portions 1111A, 1111B, 1025A, and 1025B is removed (e.g., cut) in the process of FIG. 13. Portions 1311A and 1311B (FIG. 13) can form a read channel region for memory cell 212' (and for memory cell 213' (under memory cell 212') shown in FIG. 17). Portions 1325A and 1325B (FIG. 13) can form dielectrics (e.g., channel oxide regions) to electrically separate portions 1311A and 1311B from other elements (e.g., write channel regions and charge storage structures) of memory cell 212' (and memory cell 213', shown in FIG. 17).

As shown in FIG. 13, structure 1371 can include portions 1310A', 1310B', 1315A', and 1315B' that can form part of memory cell 214' (which can correspond to memory cell 214 of memory device 200 of FIG. 2 and FIG. 5). Portions 1310A', 1310B', 1315A', and 1315B' (FIG. 13) are the remaining parts of portions 1110A, 1110B, 1015A, and 1015B (FIG. 12), respectively, after part of each of portions 1110A, 1110B, 1015A, and 1015B is removed (e.g., cut) in the process of FIG. 13. Portions 1310A' and 1310B' (FIG. 13) can form a read channel region for memory cell 214' (and for a memory cell (not shown) located under memory cell 214'). Portions 1315A' and 1315B' (FIG. 13) can form dielectrics (e.g., channel oxide regions) to electrically separate portions 1310A' and 1310B' from other elements (e.g., write channel regions and charge storage structures) of memory cell 214' (and memory cell 215', shown in FIG. 17).

As shown in FIG. 13, structure 1371 can also include portions 1311A', 1311B', 1325A', and 1325B' that can form part of memory cell 216' (which can correspond to memory cell 216 of memory device 200 of FIG. 2 and FIG. 5). Portions 1311A', 1311B', 1325A', and 1325B' (FIG. 13) are the remaining parts of portions 1110A, 1110B, 1015A, and 1015B (FIG. 12), respectively, after part of each of portions 1110A, 1110B, 1015A, and 1015B is removed (e.g., cut) in the process of FIG. 13. Portions 1311A' and 1311B' (FIG. 13) can form a read channel region for memory cell 216' (and for a memory cell (not shown) located under memory cell 216'). Portions 1325A' and 1325B' (FIG. 13) can form dielectrics (e.g., channel oxide regions) to electrically separate portions 1311A' and 1311B' from other elements (e.g., write channel regions and charge storage structures) of memory cell 216' (and memory cell 217', shown in FIG. 17). Another view (e.g., cross-sectional view) in the Y-Z directions of memory device 700 along line 14-14 of FIG. 13 is shown in FIG. 14.

Figure 14:
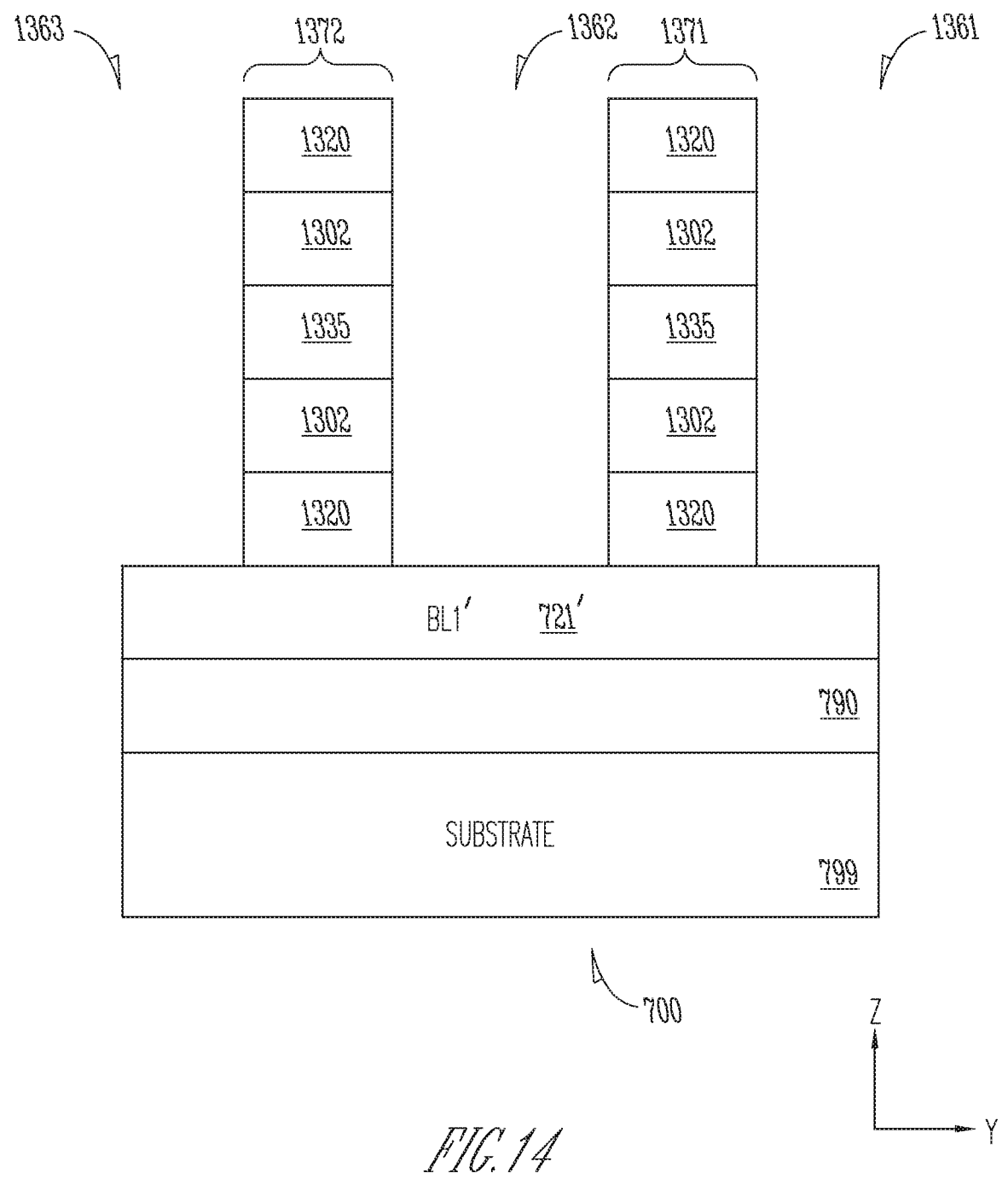

FIG. 14 shows part of each of structures 1371 and 1372 in the Y-Z directions. Each of structures 1371 and 1372 can include different portions (from top to bottom) that include material (e.g., write channel region) 1320, charge storage structure 1302, dielectric 1335, and material (e.g., another write channel region) 1320. These portions (FIG. 14) are the remaining part of respective materials (shown in FIG. 11 and FIG. 12) that include material 720, material 702, dielectric material 735, additional material 702, and additional material 720 after part of these materials were removed (e.g., cut) in the process of FIG. 13. As shown in FIG. 14, the material for data line 721' remains (e.g., was not cut) during the process of forming trenches 1361, 1362, and 1363.

Figure 15:
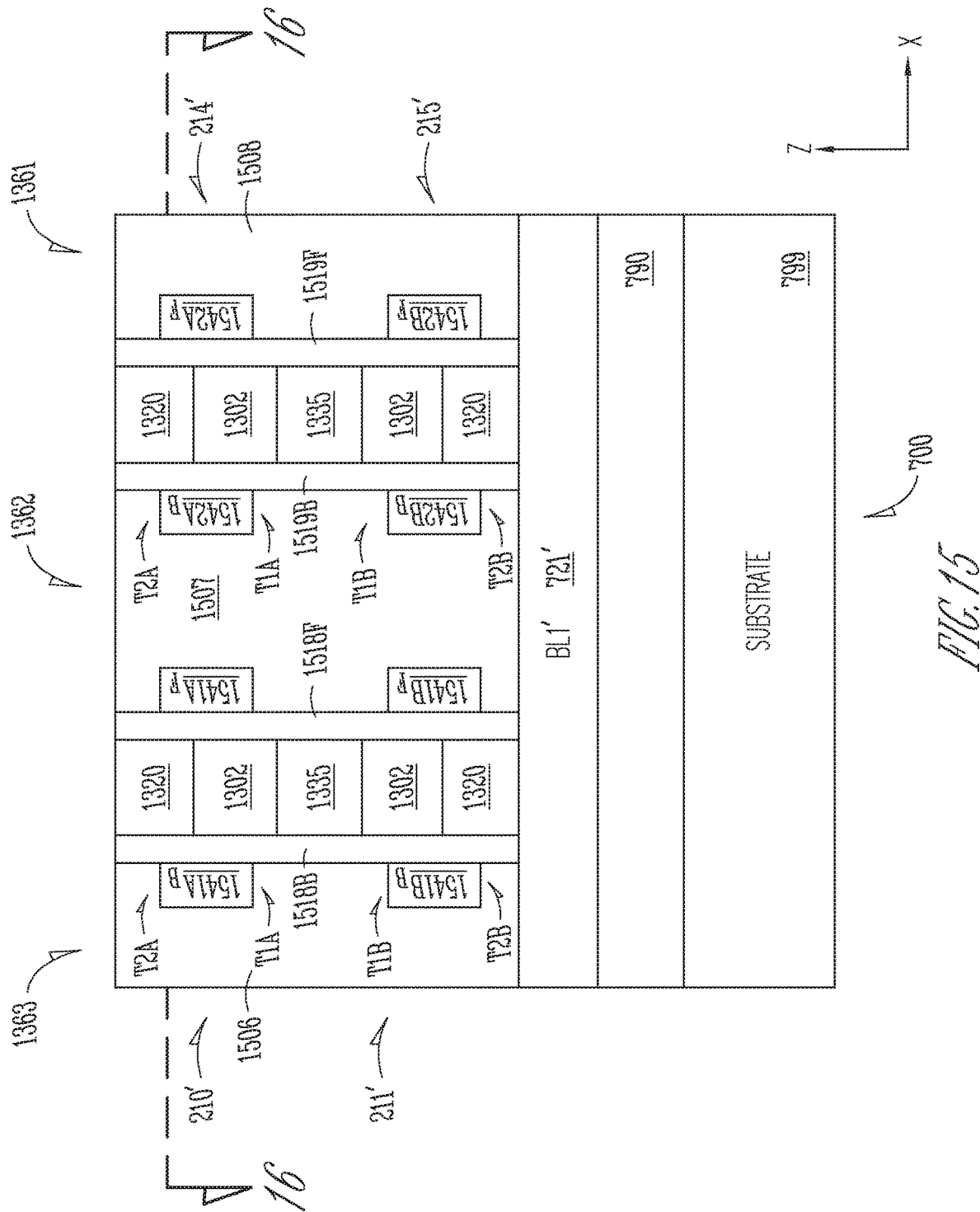

FIG. 15 shows memory device 700 of FIG. 13 after dielectrics (e.g., gate oxides) 1518F, 1518B, 1519F, and 1519B, conductive lines (e.g., conductive regions) 1541A$_F$, 1541A$_B$, 1541B$_F$, 1541B$_B$, 1542A$_F$, 1542A$_B$, 1542B$_F$, and 1542B$_B$, and dielectrics 1508, 1507, and 1506 are formed in respective trenches 1361, 1362, and 1363. Each of dielectrics 1518B, 1518F, 1519B, and 1519F and dielectrics 1506, 1507, and 1508 can include silicon dioxide or other dielectric materials. Each of conductive lines 1541A$_F$, 1541A$_B$, 1541B$_F$, 1541B$_B$, 1542A$_F$, 1542A$_B$, 1542B$_F$, and 1542B$_B$ can include metal, conductively doped polysilicon, or other conductive materials.

Conductive lines 1541A$_F$, 1541A$_B$, 1541B$_F$, 1541B$_B$, 1542A$_F$, 1542A$_B$, 1542B$_F$, and 1542B$_B$ can form part of respective access lines (e.g., word lines) to access the memory cells (e.g., memory cells 210', 211', 214', and 215' shown in FIG. 15) of memory device 700. Memory cells 210', 211', 214', and 215' can correspond to memory cells 210, 211, 214, and 215, respectively, of memory device 200 of FIG. 2 and FIG. 6.

In FIG. 15, conductive lines 1541A$_F$ and 1541A$_B$ can form part of an access line (e.g., word line) to control transistors T1A and T2A of memory cell 210' and other memory cells (not shown in FIG. 15) of memory device 700. Such other memory cells can be located in the same row with memory cell 210' in the X-direction (e.g., memory cell 212' shown in FIG. 17).

In FIG. 15, conductive lines 1541B$_F$ and 1541B$_B$ can form part of an access line (e.g., word line) to control transistors T1B and T2B of memory cell 211' and other memory cells (not shown in FIG. 15) of memory device 700. Such other memory cells can be located in the same row with memory cell 211' in the X-direction (e.g., memory cell 213' shown in FIG. 17).

In FIG. 15, conductive lines 1542A$_F$ and 1542A$_B$ can form part of an access line (e.g., word line) to control transistors T1A and T2A of memory cell 214' and other memory cells (not shown) of memory device 700. Such other memory cells can be located in the same row with memory cell 214' in the X-direction.

In FIG. 15, conductive lines 1542B$_F$ and 1542B$_B$ can form part of an access line (e.g., word line) to control transistors T1B and T2B of memory cell 215' and other memory cells (not shown) of memory device 700. Such other memory cells can be located in the same row with memory cell 215' in the X-direction.

As shown in FIG. 15, each of conductive lines 1541A$_F$, 1541A$_B$, 1541B$_F$, 1541B$_B$, 1542A$_F$, 1542A$_B$, 1542B$_F$, and 1542B$_B$ can be adjacent and separated (by dielectrics) from a respective side (e.g., right or left side in the Y-direction) of material 1320 (e.g., write channel region) and charge storage structure 1302 of a respective memory cell. For example, conductive lines 1541A$_F$ and 1541A$_B$ can be adjacent the right and left sides (in the Y-direction in the view of FIG. 15), respectively, of a portion of each of material 1320 and charge storage structure 1302 of memory cell 210'. Similarly, as shown in FIG. 15, other conductive lines 1541B$_F$, 1541B$_B$, 1542A$_F$, 1542A$_B$, 1542B$_F$, and 1542B$_B$ can be adjacent and separated from the sides (in the Y-direction in the view of FIG. 15) of a portion of each of material 1320 and charge storage structure 1302 of a respective memory cell of memory device 700. Another view (e.g., top view) of memory device 700 along line 16-16 of FIG. 15 is shown in FIG. 16.

Figure 16:
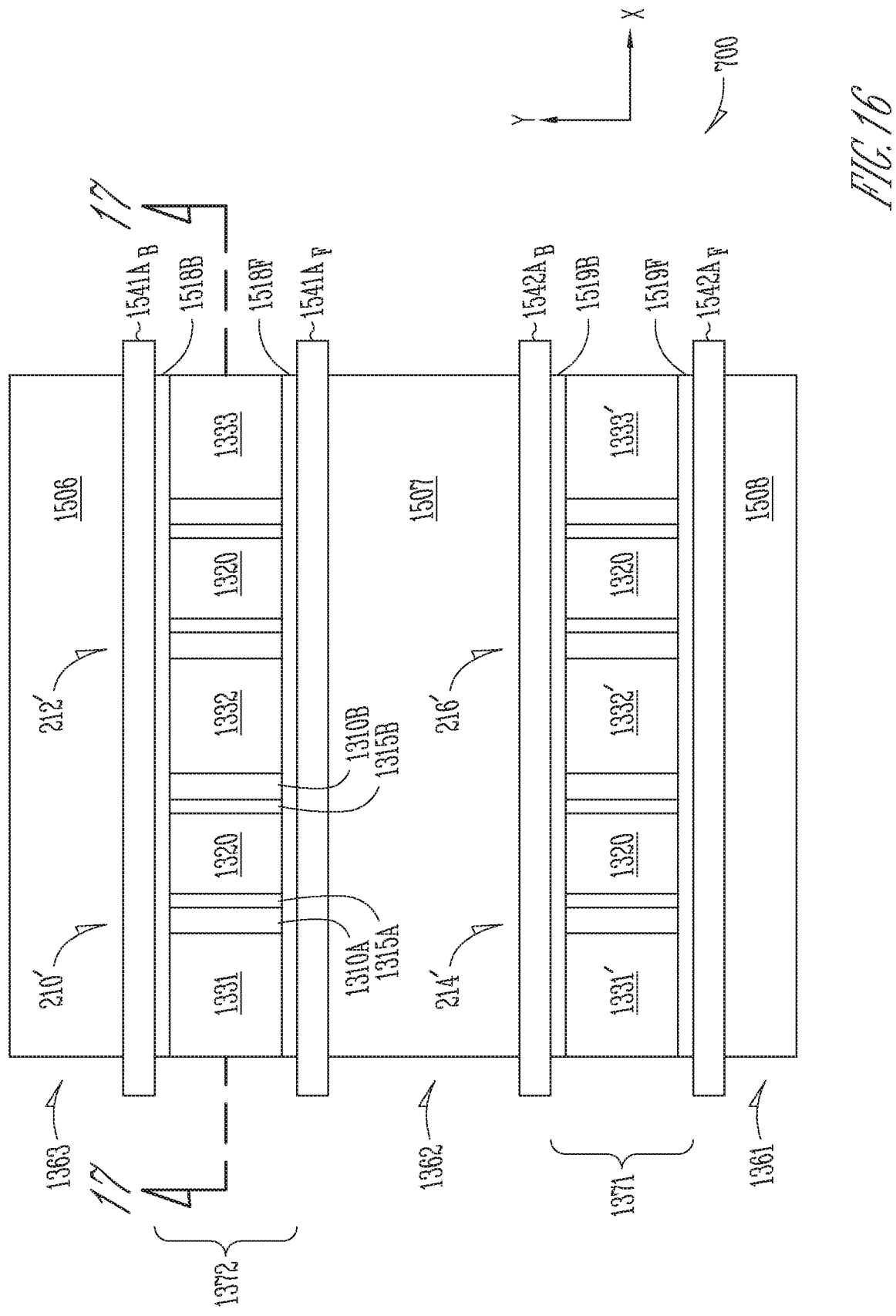

FIG. 16 shows a top view along line 16-16 of memory device 700. As shown in FIG. 16, each of conductive lines 1541A$_F$, 1541A$_B$, 1542A$_F$, and 1542A$_B$ can be located in respective trenches 1371 and 1372 and have a length in the X-direction and a thickness in the Y-direction. Other conductive lines 1541B$_F$, 1541B$_B$, 1542B$_F$, and 1542B$_B$ (which are located under respective conductive lines 1541A$_F$, 1541A$_B$, 1542A$_F$, and 1542A$_B$) are hidden from the top view of memory device 700 of FIG. 16.

As shown in FIG. 16, conductive lines 1541A$_F$, 1541A$_B$, 1542A$_F$, and 1542A$_B$ are electrically separated from the elements of memory cells 210', 212', 214', and 216' by respective dielectrics 1518B, 1518F, 1519B, and 1519F. For example, 1541A$_F$ and 1541A$_B$ can be electrically separated from the write channel region (e.g., material 1320), charge storage structure 1302 (located under material 1320), and read channel regions (e.g., portions 1310A and 1310B) of memory cell 210'. For simplicity, FIG. 16 omits labels for some of the elements of memory cells 212', 214', and 216' that are similar to the elements of memory cell 210'. Another view (e.g., cross-sectional view) of memory device 700 along line 17-17 of FIG. 16 is shown in FIG. 17.

FIG. 17 shows a view along line 17-17 of FIG. 16 with respect to the X-Z directions. In FIG. 17, conductive lines 1701 and 1702 are partially shown to avoid obstructing some parts of the other the elements of memory device 700. As shown in FIG. 17, each of conductive lines 1701 and 1702 can have a length in the X-direction, and a width in the Z-direction (the width is greater than the thickness shown in FIG. 16).

FIG. 17 shows the elements of memory cells 210', 211', 212', and 213' that are also shown in FIG. 13 through and FIG. 16. Thus, for simplicity, the description of the same elements (which have the same labels) among FIG. 13 through FIG. 17 is not repeated.

As shown in FIG. 17, each of memory cells 210', 211', 212', and 213' can have a read transistor (e.g., transistor T1A or T1B) and a write transistor (e.g., transistor T2A or T2B). Each of portions 1310A, 1310B, 1311A, and 1311B can form a channel region (e.g., read channel region) of the read transistor of a respective memory cell among memory cells 210', 211', 212', and 213'. Each of portions 1310A, 1310B, 1311A, and 1311B can also form a shared channel region (e.g., a shared read channel region) of the read transistors of a respective memory cell pair among memory cells 210', 211', 212', and 213'. For example, portion 1310A can form a shared channel region (e.g., shared read channel region) of transistors T1A and T1B of memory cells 210' and 211', respectively. In another example, portion 1310B can form a shared channel region (e.g., shared read channel region) of transistors T1A and T1B of memory cells 210' and 211', respectively. In another example, portion 1311A can form a shared channel region (e.g., shared read channel region) of transistors T1A and T1B of memory cells 212' and 213', respectively. In another example, portion 1311B can form a shared channel region (e.g., shared read channel region) of transistors T1A and T1B of memory cells 212' and 213', respectively.

Each of materials 1320 can form a channel region (e.g., write channel region) of the write transistor of a respective memory cell among memory cells 210', 211', 212', and 213'. Dielectrics 1315A, 1315B, 1325A, and 1325B can form a channel oxide region to electrically separate the read channel region of a respective memory cell from the write channel region and the charge storage structure of the respective memory cell.

In FIG. 17, conductive lines 1541A$_F$ and 1541A$_B$ can be part of an access line (e.g., word line) 1541A (which can receive a signal (e.g., word line signal) WL1A) to control transistors T1A and T2A of each of memory cells 210' and 212' during an operation (e.g., read or write) of memory device 700. Conductive lines 1541B$_F$ and 1541B$_B$ can be part of an access line (e.g., word line) 1541B (which can receive a signal (e.g., word line signal) WL1B) to control transistors T1B and T2B of each of memory cells 211' and 213' during an operation (e.g., read or write) of memory device 700. Access lines 1541A and 1541B can correspond to access lines 241A and 241B of memory device 200 of FIG. 2.

As shown in FIG. 17, each of conductive lines 1541A$_F$ and 1541A$_B$ can span across (e.g., overlap in the X-direction) part of the read channel region (e.g., portion 1310A and 1310B) of transistor TI A and part of the write channel region (e.g., portion 1320) of transistor T2A of memory cell 210'. Each of conductive lines 1541A$_F$ and 1541A$_B$ can also span across (e.g., overlap in the X-direction) part of the read channel region (e.g., portion 1311A and 1311B) of transistor TI A and part of the write channel region (e.g., portion 1320) of transistor T2A of memory cell 212'.

Each of conductive lines 1541B$_F$ and 1541B$_B$ can span across (e.g., overlap in the X-direction) part of the read channel region (e.g., portion 1310A and 1310B) of transistor T1B and part of the write channel region (e.g., portion 1320) of transistor T2B of memory cell 211'. Part of each of conductive lines 1541B$_F$ and 1541B$_B$ can also span across (e.g., overlap in the X-direction) part of the read channel region (e.g., portion 1311A and 1311B) of transistor T1B and part of the write channel region (e.g., portion 1320) of transistor T2B of memory cell 213'.

The processes of forming memory device 700 (e.g., in FIG. 15) can include forming a conductive connection 1541A' as shown in FIG. 17. Conductive connection 1541A' can include a conductive material (e.g., metal)) to electrically couple conductive lines 1541A$_F$ and 1541A$_B$ to each other. Similarly, processes of forming memory device 700 (e.g., in FIG. 15) can include forming a conductive connection 1541B' as shown in FIG. 17. Conductive connection 1541B' can include a conductive material (e.g., metal)) to electrically couple conductive lines 1541B$_F$ and 1541B$_B$ to each other.

Figure 18:
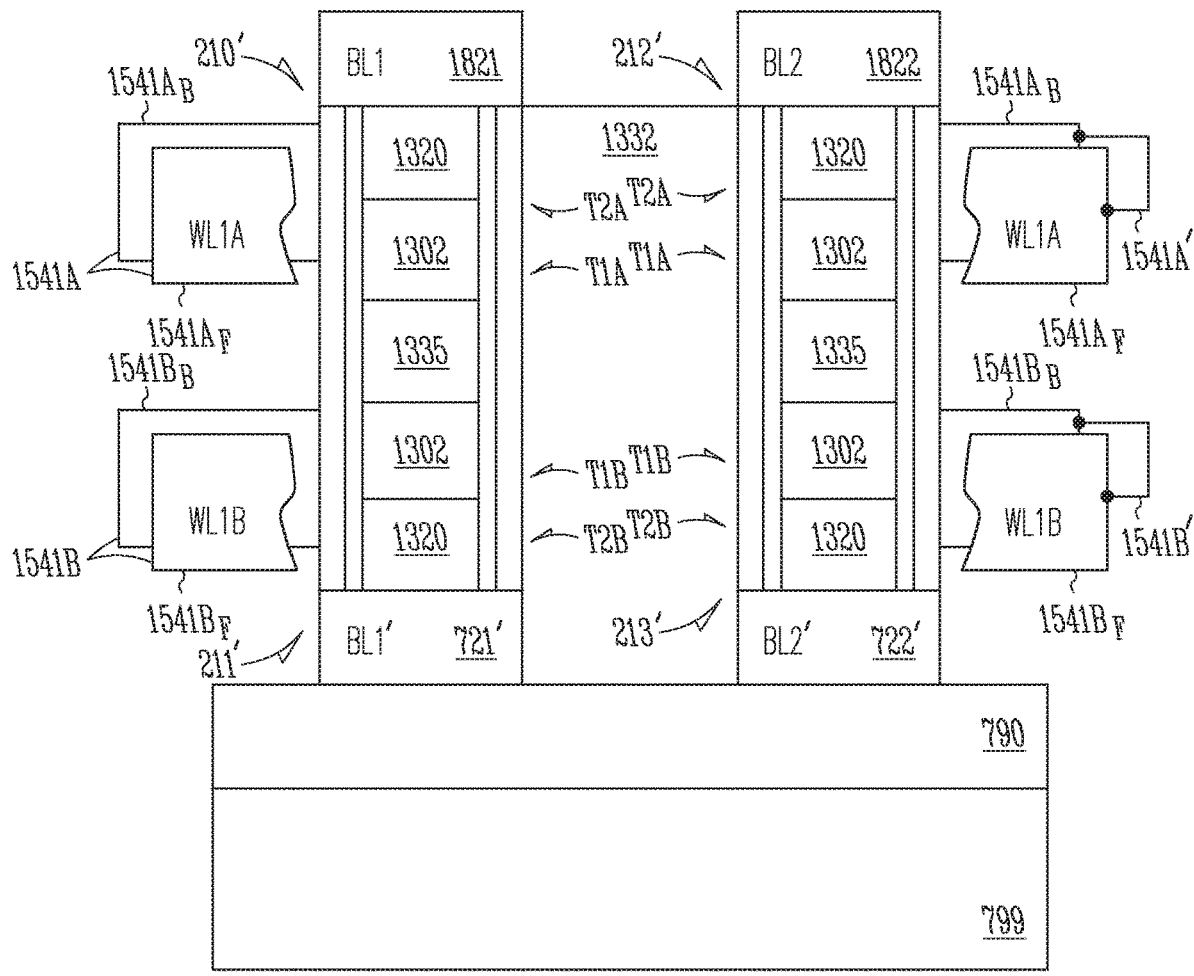

FIG. 18 shows memory device 700 after data lines 1821 and 1822 are formed (e.g., deposited) over elements of respective memory cells 210' and 212' of memory device 700. As shown in FIG. 18, data line 1821 can contact (e.g., electrically couple to) the read channel region (e.g., portions 1310A and 1310B) and the write channel region (e.g., material 1320) of transistors T1A and T2A, respectively, of memory cell 210'. Data line 1822 can contact (e.g., electrically couple to) the read channel region (e.g., portions 1311A and 1311B) and the write channel region (e.g., material 1320) of transistors T1A and T2A, respectively, of memory cell 212'. The material for data lines 1821 and 1822 can be the same as the material for data lines 721' and 722'. Like each of data lines 721' and 722', each of data lines 1821 and 1822 can have length extending in the Y-direction. Data lines 1821 and 1822 can correspond to data lines 221 and 222, respectively, of memory device 200 of FIG. 2.

The description of forming memory device 700 with reference to FIG. 7 through FIG. 18 can include other processes to form a complete memory device. Such processes are omitted from the above description so as not to obscure the subject matter described herein.

The process of forming memory device 700 as described above can have a relatively reduced number of masks (e.g., reduced number of critical masks) in comparison with some conventional processes. For example, by forming trenches 801, 802, and 803 in the process associated with FIG. 8, and forming trenches 1361, 1362, and 1363 in the process associated with FIG. 13, the number of critical masks used to form the memory cells of a memory device can be reduced. The reduced number of masks can simplify the process, reduce cost, or both, of forming memory device 700. Further, forming some of the elements (e.g., a charge storage structure and write channel region) using the techniques described herein can be more advantageous than using some other techniques. For example, some of the structures (e.g., charge storage structure and write channel region) of the memory cells described herein can formed by depositing a material over (e.g., on top of) another material instead of using other methods (e.g., atomic layer deposition). Using the techniques described herein can result in more defined structures (e.g., charge storage structure and write channel region) for the described memory cells.

The illustrations of apparatuses (e.g., memory devices 100, 200, and 700) and methods (e.g., operations of memory devices 100 and 200, and methods of forming memory device 700) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 700) or a system (e.g., an electronic item that can include any of memory devices 100, 200, and 700).

Any of the components described above with reference to FIG. 1 through FIG. 18 can be implemented in a number of ways, including simulation via software. Thus, apparatuses (e.g., memory devices 100, 200, and 700) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, and 700) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 18 include apparatuses and methods of forming the apparatuses. One of the apparatuses includes a first data line located in a first level of the apparatus; a second data line located in a second level of the apparatus; a first memory cell located in a third level of the apparatus between the first and second levels, the first memory cell including a first transistor coupled to the first data line, and a second transistor coupled between the first data line and a charge storage structure of the first transistor; and a second memory cell located in a fourth level of the apparatus between the first and second levels, the second memory cell including a third transistor coupled to the second data line, and a fourth transistor coupled between the second data line and a charge storage structure of the third transistor, the first transistor coupled in series with the third transistor between the first and second data lines. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first data line located in a first level of the apparatus;
a second data line located in a second level of the apparatus;
a first memory cell located in a third level of the apparatus between the first and second levels, the first memory cell including a first transistor coupled to the first data line, and a second transistor coupled between the first data line and a charge storage structure of the first transistor; and
a second memory cell located in a fourth level of the apparatus between the first and second levels, the second memory cell including a third transistor coupled to the second data line, and a fourth transistor coupled between the second data line and a charge storage structure of the third transistor, the first transistor coupled in series with the third transistor between the first and second data lines.

2. The apparatus of claim 1, wherein the first and second transistors have different transistor types, and the third and fourth transistors have different transistor types.

3. The apparatus of claim 1, wherein the first and second transistors have different threshold voltages, and the third and fourth transistors have different threshold voltages.

4. The apparatus of claim 1, wherein each of the first and second charge storage structures includes polysilicon.

5. The apparatus of claim 1, wherein:
the second transistor includes a first semiconducting oxide material contacting the first data line and the first charge storage structure; and
the fourth transistor includes a second semiconducting oxide material contacting the second data line and the second charge storage structure.

6. The apparatus of claim 1, further comprising:
a first conductive line spanning across part of each of the first and second transistors; and
a second conductive line spanning across part of each of the third and fourth transistors.

7. The apparatus of claim 6, further comprising:
a first additional conductive line spanning across part of each of the first and second transistors; and
a second additional conductive line spanning across part of each of the third and fourth transistors.

8. The apparatus of claim 1, further comprising:
a third data line located in the first level;
a fourth data line located in the second level;
a third memory cell located in the third level, the third memory cell including a fifth transistor coupled to the third data line, and a sixth transistor coupled to the fifth transistor;
a fourth memory cell located in the fourth level, the fourth memory cell including a seventh transistor coupled to the fourth data line, and an eighth transistor coupled to the seventh transistor, the seventh transistor coupled in series with the fifth transistor between the third and fourth data lines;
a first conductive line spanning across part of each of the first and second transistors, and part of each of the fifth and sixth transistors; and
a second conductive line spanning across part of each of the third and fourth transistors, and part of each of the seventh and eighth transistors.

9. The apparatus of claim 8, further comprising:
a first additional conductive line spanning across part of each of the first and second transistors, and part of each of the fifth and sixth transistors; and
a second additional conductive line spanning across part of each of the third and fourth transistors, and part of each of the seventh and eighth transistors.

10. An apparatus comprising:
a first conductive region located in a first level of the apparatus;
a second conductive region located in a second level of the apparatus;
a first charge storage structure located in a third level of the apparatus between the first and second levels;
a first semiconductor material located between and contacting the first conductive region and the first charge storage structure;
a second charge storage structure located in a fourth level of the apparatus between the second and third levels;
a second semiconductor material located between and contacting the second conductive region and the second charge storage structure;
a third semiconductor material extending between the first and second levels and contacting the first and second conductive regions;
a first dielectric located between and contacting the first and second charge storage structures; and
a second dielectric separating the third semiconductor material from each of the first and second semiconductor materials and the first and second charge storage structures.

11. The apparatus of claim 10, further comprising a fourth semiconductor material extending between the first and second levels and contacting the first and second conductive regions.

12. The apparatus of claim 11, further comprising a third dielectric separating the fourth semiconductor material from each of the first and second semiconductor materials and the first and second charge storage structures.

13. The apparatus of claim 10, wherein:
the first charge storage structure forms part of a first transistor of a first memory cell;
the second charge storage structure forms part of a second transistor of a second memory cell; and
the third semiconductor material forms a shared channel region of the first and second transistors.

14. The apparatus of claim 10, wherein each of the first and second semiconductor materials has a first conductivity type, and the third semiconductor material has a second conductivity type.

15. The apparatus of claim 10, wherein each of the first and second semiconductor materials has an n-type conductivity, and the third semiconductor material has a p-type conductivity.

16. The apparatus of claim 10, wherein the first semiconductor material comprises a same material as the second semiconducting material.

17. The apparatus of claim 10, wherein each of the first and second semiconductor materials comprises a semiconducting oxide material.

18. The apparatus of claim 10, wherein each of the first and second semiconductor materials comprises at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($MgZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

19. The apparatus of claim 10, further comprising:
a third conductive region spanning across part of each of the first and third semiconductor materials; and
a fourth conductive region spanning across part of each of the second and third semiconductor materials.

20. The apparatus of claim 19, further comprising:
a third additional conductive region spanning across part of each of the first and third semiconductor materials;
a fourth additional conductive region spanning across part of each of the second and third semiconductor materials.

* * * * *